(12) United States Patent
Okuyama et al.

(10) Patent No.: US 11,267,216 B2
(45) Date of Patent: Mar. 8, 2022

(54) POLYMER FILM LAMINATED SUBSTRATE AND METHOD FOR PRODUCING FLEXIBLE ELECTRONIC DEVICE

(71) Applicant: TOYOBO CO., LTD., Osaka (JP)

(72) Inventors: Tetsuo Okuyama, Otsu (JP); Naoki Watanabe, Otsu (JP); Toshiyuki Tsuchiya, Otsu (JP); Masahiro Yamashita, Otsu (JP); Kaya Tokuda, Otsu (JP)

(73) Assignee: TOYOBO CO., LTD., Osaka (JP)

( * ) Notice: Subject to any disclaimer, the term of this patent is extended or adjusted under 35 U.S.C. 154(b) by 405 days.

(21) Appl. No.: 16/479,825

(22) PCT Filed: Jan. 23, 2018

(86) PCT No.: PCT/JP2018/001901
§ 371 (c)(1),
(2) Date: Jul. 22, 2019

(87) PCT Pub. No.: WO2018/139427
PCT Pub. Date: Aug. 2, 2018

(65) Prior Publication Data
US 2020/0180259 A1    Jun. 11, 2020

(30) Foreign Application Priority Data

| Jan. 25, 2017 | (JP) | JP2017-010991 |
| Jan. 25, 2017 | (JP) | JP2017-010992 |
| Jan. 25, 2017 | (JP) | JP2017-010993 |

(51) Int. Cl.
| *B32B 3/10* | (2006.01) |
| *B32B 27/28* | (2006.01) |
| *B32B 7/06* | (2019.01) |
| *B32B 9/00* | (2006.01) |
| *H01L 23/14* | (2006.01) |

(52) U.S. Cl.
CPC .............. *B32B 3/10* (2013.01); *B32B 7/06* (2013.01); *B32B 9/00* (2013.01); *B32B 27/281* (2013.01); *H01L 23/145* (2013.01); *B32B 2307/582* (2013.01); *B32B 2307/748* (2013.01); *B32B 2457/14* (2013.01)

(58) Field of Classification Search
CPC ........................................................ B32B 7/06
USPC ....................................................... 428/195.1
See application file for complete search history.

(56) References Cited

U.S. PATENT DOCUMENTS

2015/0344360 A1    12/2015  Tanaka

FOREIGN PATENT DOCUMENTS

| JP | 2010-283262 A | 12/2010 |
| JP | 2011-011455 A | 1/2011 |
| JP | 2011-245675 A | 12/2011 |
| JP | 2013-010342 A | 1/2013 |
| JP | 2013-168445 A | 8/2013 |
| JP | 2014-237270 A | 12/2014 |
| JP | 2016-005899 A | 1/2016 |

OTHER PUBLICATIONS

Japanese Patent Office, International Search Report in International Patent Application No. PCT/JP2018/001901 (dated May 1, 2018).

*Primary Examiner* — Ian A Rummel
(74) *Attorney, Agent, or Firm* — Leydig, Voit & Mayer, Ltd.

(57) ABSTRACT

[Problem] To provide a polyimide film laminated substrate in which stable peeling with a constant low force from an inorganic substrate is enabled when a polyimide film is to be peeled from an inorganic substrate even after heat treatment at a temperature exceeding 500° C. is performed.
[Solution] Silane coupling agent treatment is performed on an inorganic substrate on which a thin film of an aluminum oxide, a thin film of a composite oxide of aluminum and silicon, a thin film of molybdenum or tungsten, or an alloy thin film of molybdenum and tungsten is formed continuously or discontinuously on a part of at least one surface thereof, and a polyimide film layer is further laminated on the silane coupling agent layer. In the obtained laminate, the part where the aluminum oxide thin film layer is present functions as an easily-peelable layer, the part where no aluminum oxide thin film layer functions as an easily-bondable part. The bonding strength of the easily-peelable part does not change even after heat treatment at 500° C. or more, and the low value is stably maintained.

9 Claims, No Drawings

POLYMER FILM LAMINATED SUBSTRATE AND METHOD FOR PRODUCING FLEXIBLE ELECTRONIC DEVICE

CROSS-REFERENCE TO RELATED APPLICATIONS

This patent application is the U.S. national phase of International Patent Application No. PCT/JP2018/001901, filed Jan. 23, 2018, which claims the benefit of Japanese Patent Application No. 2017-010991, filed on Jan. 25, 2017, and Japanese Patent Application No. 2017-010992, filed on Jan. 25, 2017, and Japanese Patent Application No. 2017-010993, filed on Jan. 25, 2017, which are incorporated by reference in their entireties herein.

TECHNICAL FIELD

The present invention relates to a polymer film laminated substrate including a thin film between an inorganic substrate and a polymer film layer (hereinafter also referred to as "polymer film"), which is useful for producing a flexible electronic device and is excellent in the recyclability of the inorganic substrate.

In recent years, with the aim of reducing the weight, the size, and thickness and achieving higher flexibility of functional elements such as semiconductor elements, MEMS elements, and display elements, development of a technology of forming these elements on a polymer film has been actively conducted. That is, as materials of base materials of electronic components such as information communication devices (broadcast devices, mobile radios, mobile communication devices, and the like), radars, high-speed information processing devices, and the like, ceramics that have heat resistance and can cope with the higher frequency (up to the GHz band) of signal bands of the information communication devices have been used. However, since ceramics are not flexible and it is difficult to be reduced in thickness, there has been a drawback that the applicable field is limited. Therefore, a polymer film has been used as a substrate in recent years.

When functional elements such as semiconductor devices, MEMS elements, and display elements are to be formed on the surface of a polymer film, it is ideal to employ a so-called roll-to-roll process using the flexibility that is the characteristic of polymer film. However, in the industries such as the semiconductor industry, the MEMS industry, the display industry, and the like, up to now, a process technology for a rigid flat substrate such as a wafer base or a glass substrate base has been constructed. Therefore, in order to form a functional element on a polymer film using existing infrastructure, there has been used a process of bonding the polymer film to a rigid support made of an inorganic substance such as a glass plate, a ceramic plate, a silicon wafer, or a metal plate, forming a desired element thereon, and then peeling it from the support.

Incidentally, in the process of forming a desired functional element on a laminate obtained by bonding a polymer film and a support made of an inorganic substance, the laminate is often exposed to high temperature. For example, in the formation of functional elements such as polysilicon and oxide semiconductors, a process in a temperature range of about 200 to 500° C. is required. Further, heating at about 450° C. may be required for dehydrogenation in the fabrication of low temperature polysilicon thin film transistors, and a temperature of about 200 to 300° C. may be applied in the fabrication of hydrogenated amorphous silicon thin films. Therefore, although heat resistance is demanded in a polymer film forming a laminate, polymer films which can be practically used in this high temperature area are limited as a practical problem. In addition, although a pressure-sensitive adhesive or an adhesive is generally considered to be used for bonding the polymer film to the support, the bonding surface between the polymer film and the support at that time (namely, a bonding adhesive or pressure-sensitive adhesive) are also required to have heat resistance. However, since a general bonding adhesive or pressure-sensitive adhesive does not have sufficient heat resistance, bonding using an adhesive or pressure-sensitive adhesive cannot be applied when the temperature at which the functional element is formed is high.

Since there is no heat-resistant bonding means for bonding a polymer film to an inorganic substrate, in such applications, there has been known technology of applying a polymer solution or a precursor solution of a polymer on an inorganic substrate and drying and curing it on a support to form a film so as to be used for the application. However, since the polymer film obtained by such means is fragile and easily torn, the functional element formed on the surface of the polymer film is often broken when it is peeled from the support. In particular, it is extremely difficult to peel a large-area film from a support, and it is not possible to obtain a yield enough for industries.

In view of such circumstances, as a laminate of a polymer film and a support for forming a functional element, there has been proposed a laminate obtained by bonding a polyimide film which is excellent in heat resistance, is tough, and can be thinned to a support (an inorganic layer) made of an inorganic substance through a silane coupling agent (Patent Documents 1 to 3).

Incidentally, a polymer film is originally a flexible material, and may undergo some expansion and contraction or bending and stretching. On the other hand, a functional element formed on a polymer film often has a fine structure in which a conductor made of an inorganic substance and a semiconductor are combined in a predetermined pattern, and due to a stress such as micro expansion and contraction or bending and stretching, the structure is destroyed and the characteristics as the electronic device are hindered. Such stress is likely to occur when the polymer film is peeled together with the functional element from the inorganic substrate. Therefore, in the laminates described in Patent Documents 1 to 3, when the polymer film is peeled from the support, the structure of the functional element may be broken.

In view of this, the following technology has been proposed. Specifically, when an inorganic substrate is subjected to a coupling agent treatment to form a coupling treatment layer, and then a part of the coupling treatment layer is subjected to inactivation treatment to bond a polyimide film, there are formed an easily-bondable part that is relatively difficult to be peeled from the inorganic substrate and an easily-peelable part that is relatively easy to be peeled from the inorganic substrate, a functional element is formed on the easily-peelable part of the polyimide film, and the easily-peelable part of the polyimide film is cut so that only the easily-peelable part is peeled together with the functional element. In this manner, the polyimide film can be peeled from the inorganic substrate in a state in which a stress applied to the functional element is reduced (Patent Document 4).

PRIOR ART DOCUMENTS

Patent Documents

Patent Document 1: JP 2010-283262 A
Patent Document 2: JP 2011-11455 A
Patent document 3: JP 2011-245675 A
Patent Document 4: JP 2013-010342 A

SUMMARY OF THE INVENTION

Problems to be Solved by the Invention

In Patent Document 4 mentioned above, the laminate can be subjected to a process of forming a functional element directly on an inorganic substrate such as a conventional glass plate or silicon wafer, and further, the easily-bondable part and the easily-peelable part are provided. Thus, the functional element formed on the polymer film can be relatively easily peeled from the inorganic substrate together with the polymer film. Therefore, it is very useful in fabricating flexible electronic devices. However, even in the proposal of such a technology, not all the problems are necessarily solved.

In particular, a high temperature of 420° C. or higher, preferably 460° C. or higher, more preferably 505° C. or higher may be used during the processing process to improve the performance of the device. In general, as the process temperature becomes higher, the film quality of a vacuum thin film is great, and high temperature annealing is generally performed to improve the physical properties of a thin film. However, these temperatures, which are not a major problem for glass substrates, are a major problem for polymer films that are organic substances.

Although the heat resistance of the polymer film, preferably the polyimide film itself, is unquestionably mentioned, a problem on which the present invention particularly focuses is the bonding property between the polymer film and the inorganic substrate.

The technology disclosed in Patent Document 4 above intends chemical bonding between individual surfaces of the surface of the polymer film and the surface of the inorganic substrate which are subjected to surface treatment. Chemical reactions among individuals are limited because reaction sites cannot move freely. However, when the temperature of the reaction site rises to 420° C. or higher, preferably 460° C. or higher, more preferably 505° C. or higher, almost all polymer compounds are in the range of the glass transition temperature or the melting point temperature. The same interpretation holds true for polyimide resins, and many polyimide film resins have a gradual transition point at around 330° C. to 400° C. Therefore, when that temperature is exceeded, the freedom of movement of reaction sites on the surface increases, so that the reactivity between individual surfaces is high.

As a result, in a process having process temperature higher than such temperature, increase of the chemical bond sites between the polymer film and the inorganic substrate or increase of the chemical bonding strength occurs, and the bonding strength between the polymer film and the inorganic substrate increases. Although this phenomenon can be said to be a good effect on the bonding surface, from the standpoint of finally peeling the polymer film from the inorganic substrate to produce a flexible device, there is caused a problem that a large tension is applied to the polymer film at the time of peeling of the polymer film, and the risk of damage to the device due to bending deformation to the device at the time of stretching or peeling of the polymer film is increased.

Solutions to the Problems

As a result of intensive studies to solve the problems described above, the present inventors have found that, by forming a specific thin film on a part of at least one surface of an inorganic substrate surface using a predetermined material, and applying a silane coupling agent on the thin film, the silane coupling agent can be stably and uniformly applied. As a result, when the polymer film is laminated on the silane coupling agent layer, it becomes possible to easily peel the polymer film together with the silane coupling agent layer from the inorganic substrate in the easily-peelable part. As a result, it becomes possible to produce highly accurate flexible electronic devices with a high yield, and to improve the recyclability of the inorganic substrate.

That is, the present invention has the following configuration.

[1] A polymer film laminated substrate including a thin film continuously or discontinuously formed on a part of at least one surface of an inorganic substrate; a silane coupling agent layer continuously or discontinuously formed on the thin film; and further a polymer film layer laminated on the silane coupling agent layer, in which
the thin film is an aluminum oxide,
a surface on which the polymer film is laminated includes: an easily-peelable part being a region in which the polymer film can be easily separated from the inorganic substrate together with the silane coupling agent layer when the polymer film is cut; and an easily-bondable part being a region in which the polymer film cannot be easily separated from the inorganic substrate, and
bonding strength of the easily-peelable part is 0.5 N/cm or less.
[2] The polymer film laminated substrate according to the item [1], in which the bonding strength of the easily-peelable part after heat treatment at 500° C. for 10 minutes is 0.5 N·cm or less.
[3] The polymer film laminated substrate according to item [1] or [2], in which the thin film is discontinuously formed on at least one surface of the inorganic substrate, the easily-peelable part is covered with the thin film, and the easily-bondable part is not covered with the thin film.
[4] The polymer film laminated substrate according to any one of the items [1] to [3], in which the polymer film is a polyimide film.
[5] The polymer film laminated substrate according to any one of the items [1] to [4], which is used to temporarily support a polymer film material on the inorganic substrate when an electronic device is formed on the polymer film.
[6] A method for producing a flexible electronic device, including the steps of:
continuously or discontinuously forming an aluminum oxide thin film on a part of at least one surface of an inorganic substrate;
continuously or discontinuously forming a silane coupling agent layer on the thin film;
laminating a polymer film layer on the silane coupling agent layer;
forming an electronic device on the polymer film; and
cutting the polymer film layer and peeling at least a part of the polymer film layer from the inorganic substrate together with the electronic device.

[7] A polymer film laminated substrate including a thin film continuously or discontinuously formed on a part of at least one surface of an inorganic substrate; a silane coupling agent layer continuously or discontinuously formed on the thin film; and further a polymer film layer laminated on the silane coupling agent layer, in which the thin film is a composite oxide of aluminum and silicon, a surface on which the polymer film is laminated includes: an easily-peelable part being a region in which the polymer film can be easily separated from the inorganic substrate together with the silane coupling agent layer when the polymer film is cut; and an easily-bondable part being a region in which the polymer film cannot be easily separated from the inorganic substrate, and bonding strength of the easily-peelable part is 0.5 N/cm or less.

[8] The polymer film laminated substrate according to the item [7], in which the bonding strength of the easily-peelable part after heat treatment at 500° C. for 10 minutes is 0.5 N·cm or less.

[9] The polymer film laminated substrate according to item [7] or [8], in which the thin film is discontinuously formed on at least one surface of the inorganic substrate, the easily-peelable part is covered with the thin film, and the easily-bondable part is not covered with the thin film.

[10] The polymer film laminated substrate according to any one of the items [7] to [9], in which the polymer film is a polyimide film.

[11] The polymer film laminated substrate according to any one of the items [7] to [10], which is used to temporarily support a polymer film material on the inorganic substrate when an electronic device is formed on the polymer film.

[12] A method for producing a flexible electronic device, including the steps of:

continuously or discontinuously forming a composite oxide thin film of aluminum and silicon on a part of at least one surface of an inorganic substrate;

continuously or discontinuously forming a silane coupling agent layer on the composite oxide thin film of aluminum and silicon;

laminating a polymer film layer on the silane coupling agent layer;

forming an electronic device on the polymer film; and cutting the polymer film layer and peeling at least a part of the polymer film layer from the inorganic substrate together with the electronic device.

[13] A polymer film laminated substrate including a thin film continuously or discontinuously formed on a part of at least one surface of an inorganic substrate; a silane coupling agent layer continuously or discontinuously formed on the thin film; and further a polymer film layer laminated on the silane coupling agent layer, in which the thin film is a thin film of at least one metal selected from molybdenum or tungsten, a surface on which the polymer film is laminated includes: an easily-peelable part being a region in which the polymer film can be easily separated from the inorganic substrate together with the silane coupling agent layer when the polymer film is cut; and an easily-bondable part being a region in which the polymer film cannot be easily separated from the inorganic substrate, and bonding strength of the easily-peelable part is 0.5 N/cm or less.

[14] The polymer film laminated substrate according to the item [13], in which the bonding strength of the easily-peelable part after heat treatment at 500° C. for 10 minutes is 0.5 N·cm or less.

[15] The polymer film laminated substrate according to item [13] or [14], in which the thin film is discontinuously formed on at least one surface of the inorganic substrate, the easily-peelable part is covered with the thin film, and the easily-bondable part is not covered with the thin film.

[16] The polymer film laminated substrate according to any one of the items [13] to [15], in which the polymer film is a polyimide film.

[17] The polymer film laminated substrate according to any one of the items [13] to [16], which is used to temporarily support a polymer film material on the inorganic substrate when an electronic device is formed on the polymer film.

[18] A method for producing a flexible electronic device, including the steps of:

continuously or discontinuously forming a thin film of at least one metal selected from molybdenum or tungsten on a part of at least one surface of an inorganic substrate;

continuously or discontinuously forming a silane coupling agent layer on the thin film of at least one metal selected from molybdenum or tungsten;

laminating a polymer film layer on the silane coupling agent layer;

forming an electronic device on the polymer film; and cutting the polymer film layer and peeling at least a part of the polymer film layer from the inorganic substrate together with the electronic device.

Furthermore, in the present invention, it is preferable to have the following configuration.

[19] The polymer film laminate according to the item [12], in which the thin film of at least one metal selected from molybdenum or tungsten is an alloy thin film of molybdenum and tungsten.

[20] The method for producing a flexible electronic device according to the item [17], in which the thin film of at least one metal selected from molybdenum or tungsten is an alloy thin film of molybdenum and tungsten.

Effects of the Invention

According to the present invention, by forming a thin film of an aluminum oxide between the polymer film and the inorganic substrate, the silane coupling agent can be applied uniformly, and when the polymer film is to be peeled from the inorganic substrate, stable peeling with a constant low force is enabled. An aluminum oxide has good wettability with a silane coupling agent which is a liquid and an alcohol solvent having a relatively low boiling point used as a solvent for the silane coupling agent during application of the silane coupling agent, and a uniform silane coupling agent film can be formed. On the other hand, the interaction with the silane coupling agent layer which has caused condensation reaction is small, and a low and stable bonding strength can be maintained. The bonding energy between an aluminum element and oxygen in the aluminum oxide is so high that interaction with silanol reaction during condensation of the silane coupling agent hardly occurs. This state is stably maintained from room temperature to a high temperature around 500° C.

However, in the case of a single oxide of aluminum, the interaction with the silane coupling agent layer is too small, and an unexpected accident in the process may cause the polymer film layer to peel. In the actual process, it is possible to reduce the risk by dividing the thin film formation region and providing an easily-bondable part with strong bonding strength around the inorganic substrate, and the like. However, the risk of defects such as scum (bubbles, or blisters) is inevitable when gas is generated from the polymer film at the time of high-temperature heat treatment.

In the present invention, this risk can be further reduced by using a composite oxide of aluminum and silicon. That is, the thin film of the complex oxide of aluminum and silicon has a slightly higher bonding property to the silane coupling agent layer than the oxide thin film of aluminum alone, and can reduce the risk of generation of scum.

Furthermore, in the present invention, by forming a thin film of at least one metal selected from molybdenum or tungsten between the polymer film and the inorganic substrate, the silane coupling agent can be applied uniformly, and when the polymer film is to be peeled from the inorganic substrate, stable peeling with a constant low force is enabled. The thin film surface of at least one metal selected from molybdenum or tungsten forms a passive state, and has good wettability with a silane coupling agent which is a liquid and an alcohol solvent having a relatively low boiling point used as a solvent for the silane coupling agent during application of the silane coupling agent, and a uniform silane coupling agent film can be formed. On the other hand, the interaction with the silane coupling agent layer which has caused condensation reaction is small, and a low and stable bonding strength can be maintained. The passive film formed on the surface of at least one metal selected from molybdenum or tungsten has a low but stable constant interaction with the silanol reaction during condensation of the silane coupling agent, and this state is stably maintained from room temperature to a high temperature of around 500° C.

Furthermore, according to the present invention, by making the thin film into a predetermined pattern, the surface on which the polymer film is laminated can be formed to be separated into the easily-peelable part being a region in which the polymer film can be easily separated from the inorganic substrate together with the silane coupling agent layer when the polymer film is cut, and the easily-bondable part being a region in which the polymer film cannot be easily separated therefrom, and by cutting the polymer film along the periphery of easily-peelable part, a functional element part formed on the polymer film in the easily-peelable part can be peeled from the inorganic substrate integrally with the polymer film.

In the present invention, if the polymer film having high heat resistance is used, the inorganic substrate and the polymer film can be bonded without using an adhesive or pressure-sensitive adhesive having poor heat resistance, and even when a high temperature of, for example, 180° C. or higher is required, a functional element can be formed on the polymer film. In general, semiconductors, dielectrics, and the like can be formed at high temperatures to obtain thin films with better film quality, and hence it can be expected to form electronic devices with higher performance.

Therefore, the polymer film laminated substrate of the present invention is useful for producing a flexible electronic device in which an electronic device such as a dielectric element, a semiconductor element, a MEMS elements, a display element, a light emitting element, a photoelectric conversion element, a piezoelectric conversion element, a thermoelectric conversion element, and the like is formed on the polymer film.

MODE FOR CARRYING OUT THE INVENTION (Polymer Film Laminated Substrate and Producing Method Therefor)

The present invention relates to a polymer film laminated substrate in which a thin film is continuously or discontinuously formed on a part of at least one surface of an inorganic substrate, a silane coupling agent layer is continuously or discontinuously formed on the thin film, and further a polymer film layer is laminated on the silane coupling agent layer.

<Inorganic Substrate>

In the present invention, an inorganic substrate is used as a support of the polymer film. In addition, even when an electronic device is formed on a polymer film to produce a flexible electronic device, the inorganic substrate is used to temporarily support a polymer film material.

The inorganic substrate may be a plate-like substrate that can be used as a substrate made of an inorganic substance, and there are given, for example, a glass plate, a ceramic plate, a semiconductor wafer, one mainly composed of metal, ones in which these are laminated as composites of glass plates, ceramic plates, semiconductor wafers, and metal, ones in which these are dispersed, and ones in which these fibers are contained.

As the glass plate, quartz glass, high silicate glass (96% silica), soda lime glass, lead glass, aluminoborosilicate glass, borosilicate glass (Pyrex (registered trademark)), borosilicate glass (alkali-free), borosilicate glass (micro sheet), aluminosilicate glass, and the like are included. Among these, ones having a linear expansion coefficient of 5 ppm/K or less are preferable, and in the case of commercial products, "Corning (registered trademark) 7059", "Corning (registered trademark) 1737" or "EAGLE" manufactured by Corning, "AN100" manufactured by Asahi Glass Co., Ltd., "OA10" manufactured by Nippon Electric Glass Co., "AF32" manufactured by SCHOTT, and the like, which are glass for liquid crystal, are preferable.

The semiconductor wafer is not particularly limited, and there are given, a silicon wafer, and wafers of germanium, silicon-germanium, gallium-arsenic, aluminum-gallium-indium, nitrogen-phosphorus-arsenic-antimony, SiC, InP (indium phosphorus), InGaAs, GaInNAs, LT, LN, ZnO (zinc oxide), CdTe (cadmium telluride), ZnSe (zinc selenide), and the like. The wafer preferably used in the present invention is a silicon wafer, particularly preferably a mirror-polished silicon wafer having a size of 8 inches or more.

As the metal, single element metals such as W, Mo, Pt, Fe, Ni, and Au, and alloys such as inconel, monel, mnemonic, carbon copper, Fe—Ni invar alloy, super invar alloy, and the like are included. In addition, multi-layer metal plates formed by adding other metal layers and ceramic layers to these metals are also included. In this case, Cu, Al, or the like may be used for the main metal layer if the overall coefficient of linear expansion (CTE) with the additional layer is low. Although the metal used as the additional metal layer is not limited as long as it has characteristics such as a strong close-contact property to the polymer film, no diffusion, and good chemical resistance and heat resistance, Cr, Ni, TiN, Cu containing Mo, and the like are given as suitable examples.

It is desirable that the flat portion of the inorganic substrate be sufficiently flat. Specifically, the P-V value of the surface roughness is 50 nm or less, more preferably 20 nm or less, still more preferably 5 nm or less. If it is rougher than this, the bonding strength between the polymer film layer and the inorganic substrate may be insufficient.

The thickness of the inorganic substrate is not particularly limited, but is preferably 10 mm or less, more preferably 3 mm or less, still more preferably 1.3 mm or less from the viewpoint of handling. The lower limit of the thickness is not particularly limited, but is preferably 0.07 mm or more, more preferably 0.15 mm or more, still more preferably 0.3 mm or more.

The area of the inorganic substrate is preferably a large area from the viewpoint of production efficiency and cost of a polymer film laminated substrate and a flexible electronic device. Specifically, it is preferably 1,000 $cm^2$ or more, more preferably 1,500 $cm^2$ or more, still more preferably 2,000 $cm^2$ or more.

<Thin Film of Aluminum Oxide>

In the present invention, the thin film is continuously or discontinuously formed on a part of at least one surface of the inorganic substrate. The following exemplification is described on the premise of the embodiment in which the polymer film is bonded only to one side of the inorganic substrate, but an embodiment in which the polymer film is bonded to both sides of the inorganic substrate is also within the scope of the present invention.

In the thin film of an aluminum oxide in the present invention, it is preferable that at least the outermost surface is an aluminum oxide having a purity of 85% or more, preferably 92% or more, more preferably 98% or more.

The thickness of the thin film is preferably 3 nm or more and 5 μm or less, more preferably 12 nm or more and 3 μm or less, further preferably 36 nm or more and 1.2 μm or less.

The method for forming the thin film is not particularly limited, and known thin film forming means such as vapor deposition, sputtering, reactive sputtering, ion beam sputtering, and CVD can be used according to the type and characteristics of a film forming source.

In the present invention, there can be exemplified a method of oxidizing aluminum by oxygen plasma treatment, anodizing treatment, atmospheric pressure plasma treatment, or the like after a metal aluminum thin film is formed, a method of depositing an aluminum oxide thin film using reactive sputtering, a method using a reactive ion cluster method, and the like.

<Thin Film of Complex Oxide of Aluminum and Silicon>

A preferred thin film in the present invention is a thin film of a composite oxide of aluminum and silicon. The preferable ratio of aluminum to silicon in the thin film of the present invention is aluminum/silicon=90/10 to 30/70 (elemental ratio), preferably 90/10 to 50/50. If the silicon ratio increases beyond this range, the interaction with the silane coupling agent may become too strong, which may cause a problem in peeling.

The thickness of the thin film is preferably 3 nm or more and 5 μm or less, more preferably 12 nm or more and 3 μm or less, further preferably 36 nm or more and 1.2 μm or less.

The method for forming the thin film is not particularly limited, and known thin film forming means such as vapor deposition, sputtering, reactive sputtering, ion beam sputtering, and CVD can be used according to the type and characteristics of a film forming source.

In the present invention, there can be exemplified a method of oxidizing aluminum by oxygen plasma treatment, anodizing treatment, atmospheric pressure plasma treatment, or the like after a metal aluminum or metal silicon thin film is formed, a method of depositing a complex oxide thin film using reactive sputtering, a method using a reactive ion cluster method, and the like. It is also possible to use reactive sputtering of metal aluminum and vapor deposition or sputtering of silicon oxide in combination.

<Thin Film of at Least One Metal Selected from Molybdenum or Tungsten>

A preferred thin film in the present invention is a thin film of at least one metal selected from molybdenum or tungsten. In the present invention, it is preferable to use a thin film of molybdenum or tungsten at the outermost surface having a purity of at least 85%, preferably 92% or more, more preferably 98% or more. Further, as an exception, an alloy of molybdenum and tungsten can be used. In this case, the alloy ratio of molybdenum to tungsten can be widely allowed from molybdenum:tungsten=1:99 to 99:1 (elemental ratio).

The thickness of the thin film is preferably 3 nm or more and 5 μm or less, more preferably 12 nm or more and 3 μm or less, further preferably 36 nm or more and 1.2 μm or less.

The method for forming the thin film is not particularly limited, and known thin film forming means such as vapor deposition, sputtering, reactive sputtering, ion beam sputtering, and CVD can be used according to the type and characteristics of a film forming source.

In the present invention, it is also possible to strengthen the non-conductive layer on the surface by oxygen plasma treatment, anodizing treatment, atmospheric pressure plasma treatment, or the like after a thin film of at least one metal selected from molybdenum or tungsten is formed.

In the present invention, the silane coupling agent means a compound which physically or chemically intervenes between the inorganic substrate and the polymer film layer and has the function of enhancing the bonding between the two.

The coupling agent is not particularly limited, but is preferably a silane coupling agent having an amino group or an epoxy group. As preferred specific examples of the silane coupling agent, there are given N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, vinyltrichlorosilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-phenyl-3-aminopropyltrimethoxysilane, N-(vinylbenzyl)-2-aminoethyl-3-aminopropyltrimethoxysilane hydrochloride, 3-ureidopropyltriethoxysilane, 3-chloropropyltrimethoxysilane, 3-mercaptopropylmethyldimethoxysilane, 3-mercaptopropyltrimethoxysilane, bis(triethoxysilylpropyl)tetrasulfide, 3-isocyanatopropyltriethoxysilane, tris-(3-trimethoxysilylpropyOisocyanurate, chloromethylphenethyltrimethoxysilane, chloromethyltrimethoxysilane, aminophenyltrimethoxysilane, aminophenethyltrimethoxysilane, aminophenylaminomethylphenethyltrimethoxysilane, and the like.

As the silane coupling agent which can be used in the present invention, in addition to the above, there can be used n-propyltrimethoxysilane, butyltrichlorosilane, 2-cyanoethyltriethoxysilane, cyclohexyltrichlorosilane, decyltrichlorosilane, diacetoxydimethylsilane, diethoxydimethylsilane, dimethoxydimethylsilane, dimethoxydiphenylsilane, dimethoxymethylphenylsilane, dodecyltrichlorosilane, dodecyltrimethoxysilane, ethyltrichlorosilane, hexyltrimethoxysilane, octadecyltriethoxysilane, octadecyltrimethoxysilane, n-octyltrichlorosilane, n-octyltriethoxysilane, n-octyltrimethoxysilane, triethoxyethylsilane, triethoxymethylsilane, trimethoxysilane, trimethoxyphenylsilane, pentyltriethoxysilane, pentyltrichlorosilane, triacetoxymethylsilane, trichlorohexylsilane, trichloromethylsilane, trichlorooctadecylsilane, trichloropropylsilane, trichlorotetradecylsilane, trimethoxypropylsilane, allyltrichlorosilane allyltriethoxysilane, allyltrimethoxysilane, diethoxymethylvinylsilane, dimethoxymethylvinylsilane, trichlorovinylsilane, triethoxyvinylsilane, vinyltris(2-methoxyethoxy)silane, trichloro-2-cyanoethylsilane, diethoxy(3-glycidyloxypropyl)methylsilane, 3-glycidyloxypropyl(dimethoxy)methylsilane, 3-glycidyloxypropyltrimethoxysilane, and the like.

In the present invention, a silane coupling agent having one silicon atom in one molecule is particularly preferred, and there are given, for example, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, aminophenyltrimethoxysilane, aminophenethyltrimethoxysilane, aminophenylaminomethylphenethyltrimethoxysilane, and the like. If particularly high heat resistance is required in the process, it is desirable to connect Si and an amino group with an aromatic group.

As a coupling agent which can be used in the present invention, coupling agents other than the above-mentioned silane coupling agents can also be used, and there can be used, for example, 1-mercapto-2-propanol, methyl 3-mercaptopropionate, 3-mercapto-2-butanol, butyl 3-mercaptopropionate, 3-(dimethoxymethylsilyl)-1-propanethiol, 4-(6-mercaptohexaroyl)benzyl alcohol, 11-amino-1-undecenethiol, 11-mercaptoundecylphosphonic acid, 11-mercaptoundecyltrifluoroacetic acid, 2,2'-(ethylenedioxy)diethanethiol, 11-mercaptoundecyltri (ethylene glycol), (1-mercaptoundeic-11-yl)tetra(ethylene glycol), 1-(methylcarboxy)undec-11-yl)hexa(ethylene glycol), hydroxyundecyl disulfide, carboxyundecyl disulfide, hydroxyhexadodecyl disulfide, carboxyhexadecyl disulfide, tetrakis(2-ethylhexyloxy)titanium, titanium dioctyloxybis(octylene glycolate), zirconium tributoxy monoacetylacetonate, zirconium monobutoxyacetylacetonate bis(ethylacetoacetate), zirconium tributoxy monostearate, acetoalkoxyaluminum diisopropylate, 3-glycidyloxypropyltrimethoxysilane, 2,3-butanedithiol, 1-butanethiol, 2-butanethiol, cyclohexanethiol, cyclopentanethiol, 1-decanethiol, 1-dodecanethiol, 2-ethylhexyl 3-mercaptopropionate, ethyl 3-mercaptopropionate, 1-heptanethiol, 1-hexadecanethiol, hexylmercaptan, isoamylmercaptan, isobutylmercaptan, 3-mercaptopropionic acid, 3-methoxybutyl 3-mercaptopropionate, 2-methyl-1-butanethiol, 1-octadecanethiol, 1-octanethiol, 1-pentadecanethiol, 1-pentanethiol, 1-propanethiol, 1-tetradecanethiol, 1-undecanethiol, 1-(12-mercaptododecyl)imidazole, 1-(11-mercaptoundecyl)imidazole, 1-(10-mercaptodecyl)imidazole, 1-(16-mercaptohexadecyl)imidazole, 1-(17-mercaptoheptadecyl)imidazole, 1-(15-mercapto) dodecanoic acid, 1-(11-mercapto)undecanoic acid, 1-(10-mercapto)decanoic acid, and the like.

<Method of Forming Silane Coupling Agent Layer>

As a method of forming the silane coupling agent layer, a method of applying a silane coupling agent solution, a vapor deposition method, or the like can be used.

As a method of applying a silane coupling agent solution, there can be used conventionally known solution application means using a solution obtained by diluting the silane coupling agent with a solvent such as alcohol, such as a spin coating method, a curtain coating method, a clip coating method, a slit die coating method, a gravure coating method, a bar coating method, a comma coating method, an applicator method, a screen printing method, a spray coating method, and the like, as appropriate. When the method of applying a silane coupling agent solution is used, it is preferable that the agent be dried quickly after application, and heat treatment is further performed at about 100±30° C. for about several tens of seconds to about 10 minutes. By the heat treatment, the silane coupling agent and the surface of the applied surface are bonded to each other by a chemical reaction.

Further, the silane coupling agent layer can also be formed by the vapor deposition method, and specifically, is formed by exposing a substrate to vapor of a silane coupling agent, that is, a silane coupling agent substantially in a gaseous state. The vapor of the silane coupling agent can be obtained by heating the silane coupling agent in a liquid state to about a temperature from 40° C. to a boiling point of the silane coupling agent. The boiling point of the silane coupling agent varies depending on the chemical structure, but is approximately in the range of 100 to 250° C. However, heating at 200° C. or higher is not preferable because it may cause a side reaction on the organic group side of the silane coupling agent.

The environment under which the silane coupling agent is heated may be any of under pressure, normal pressure, and reduced pressure, but when vaporization of the silane coupling agent is promoted, normal pressure or reduced pressure is preferable. Since many silane coupling agents are flammable liquids, it is preferable to carry out the vaporization operation in an enclosed container, preferably after the inside of the container is replaced with an inert gas.

The time for which the inorganic substrate is exposed to the silane coupling agent is not particularly limited, but is preferably within 20 hours, more preferably within 60 minutes, still more preferably within 15 minutes, most preferably within 1 minute.

It is preferable that the temperature of the inorganic substrate while the inorganic substrate is exposed to the silane coupling agent be controlled to an appropriate temperature between −50° C. and 200° C. depending on the type of silane coupling agent and the thickness of the silane coupling agent layer to be required.

The inorganic substrate exposed to the silane coupling agent is preferably heated to 70° C. to 200° C., more preferably 75° C. to 150° C. after the exposure. By this heating, the hydroxyl group and the like on the surface of the inorganic substrate reacts with the alkoxy group or silazane group of the silane coupling agent, and the silane coupling agent treatment is completed. The time required for heating is 10 seconds or more and 10 minutes or less. If the heating temperature after exposure is too high or the heating time after exposure is too long, degradation of the silane coupling agent may occur. If the heating time after exposure is too short, the treatment effect is not obtained. When the substrate temperature during exposure to the silane coupling agent is already 80° C. or higher, heating after exposure can be omitted.

In the present invention, it is preferable to use the vapor deposition method to hold downward the surface of the inorganic substrate on which the silane coupling agent layer is desired to be formed and to expose it to the silane coupling agent vapor. In the method of applying the silane coupling agent solution, the application surface of the inorganic substrate inevitably faces upward during and before and after application, and hence the possibility of deposition of floating foreign matters under the working environment on the surface of the inorganic substrate cannot be denied. However, the surface of the inorganic substrate on which the silane coupling agent layer is desired to be formed can be held downward by the vapor deposition method, which reduces the possibility of adhesion of foreign matters in the environment on the surface (or thin film surface) of the inorganic substrate or the surface of the silane coupling agent layer.

In addition, it is preferable that the surface of the inorganic substrate before the silane coupling agent treatment be cleaned by means of short wavelength UV/ozone irradiation or the like or be cleaned with a liquid cleaning agent.

The film thickness of the silane coupling agent layer is extremely thin compared to a inorganic substrate, a polymer film, or the like, is a thickness which is neglected from the viewpoint of mechanical design, and is sufficient theoretically to have a thickness of at least mono-molecular layer order. In general, it is less than 400 nm, preferably 200 nm or less, more preferably 100 nm or less for practical use, more preferably 50 nm or less, still more preferably 10 nm or less. However, if the film thickness falls within the range of 5 nm or less on calculation, the silane coupling agent layer may be present in the form of clusters rather than as a uniform application film. The film thickness of the silane coupling agent layer can be determined by an ellipsometry method or calculation from the concentration and the amount of application of the silane coupling agent solution at the time of application.

<Polymer Film>

In the present invention, the polymer film is laminated on the inorganic substrate on which the thin film and the silane coupling agent layer are formed.

As the polymer film in the present invention, there can be exemplified aromatic polyimides such as polyimide, polyamideimide, polyetherimide, fluorinated polyimide, a polyimide resin such as alicyclic polyimide, wholly aromatic polyester such as polyethylene, polypropylene, polyethylene terephthalate, polybutylene terephthalate, polyethylene-2,6-naphthalate, copolymerized polyester such as semiaromatic polyester, copolymerized (meth) acrylate represented by polymethyl methacrylate, polycarbonate, polyamide, polysulfone, polyether sulfone, polyether ketone, cellulose acetate, cellulose nitrate, aromatic polyamide, polyvinyl chloride, polyphenol, polyarylate, polyphenylene sulfide, polyphenylene oxide, polystyrene, and the like.

However, since the main premise of the present invention is to be used in a process involving heat treatment at 420° C. or higher, practically applicable polymer films among those exemplified are limited. The polymer film preferably used in the present invention is a film using a so-called super engineering plastic, preferably an aromatic polyimide film, an aromatic amide film, an aromatic amide imide film, an aromatic benzoxazole film, an aromatic benzothiazole film, and an aromatic benzimidazole film.

The details of the polyimide resin film is described below. In general, the polyimide resin film is obtained by applying a polyamide acid (polyimide precursor) solution obtained by reacting diamines and tetracarboxylic acids in a solvent on a support for fabricating a polyimide film, then drying it to obtain a green film (hereinafter also referred to as "polyamic acid film"), and further subjecting the green film to high-temperature heat treatment in a state of being on the support for fabricating a polyimide film or peeled from the support to carry out a spin-drying ring-closing reaction.

There is no particular restriction on the diamines constituting the polyamic acid, and aromatic diamines, aliphatic diamines, alicyclic diamines, and the like which are usually used for polyimide synthesis can be used. From the viewpoint of heat resistance, aromatic diamines are preferable, and among the aromatic diamines, aromatic diamines having a benzoxazole structure are more preferable. When the aromatic diamines having a benzoxazole structure are used, it is possible to develop high heat resistance, a high elastic modulus, low heat shrinkage, and a low linear expansion coefficient. The diamines may be used alone or in combination of two or more.

The aromatic diamines having a benzoxazole structure are not particularly limited, and there are given, for example, 5-amino-2-(p-aminophenyl)benzoxazole, 6-amino-2-(p-aminophenyl)benzoxazole, 5-Amino-2-(m-aminophenyl)benzoxazole, 6-amino-2-(m-aminophenyl)benzoxazole, 2,2'-p-phenylenebis(5-aminobenzoxazole), 2,2'-p-phenylenebis(6-aminobenzoxazole), 1-(5-aminobenzoxazolo)-4-(6-aminobenzoxazolo)benzene, 2,6-(4,4'-diaminodiphenyl)benzo[1,2-d:5,4-d']bisoxazole, 2, 6-(4,4'-diaminodiphenyl)benzo[1,2-d:4,5-d']bis oxazole, 2, 6-(3,4'-diaminodiphenyl)benzo[1,2-d:5,4-d']bisoxazole, 2,6-(3,4'-diaminodiphenyl)benzo[1,2-d:4,5-d']bisoxazole, 2,6-(3,3'-diaminodiphenyl)benzo[1,2-d:5,4-d']bisoxazole, 2,6-(3,3'-diaminodiphenyl)benzo[1,2-d:4,5-d']bisoxazole, and the like.

As aromatic diamines other than the aromatic diamines having the benzoxazole structure described above, there are given, for example, 2,2'-dimethyl-4,4'-diaminobiphenyl, 1,4-bis[2-(4-aminophenyl)-2-propyl]benzene(bisaniline), 1,4-bis(4-amino-2-trifluoromethylphenoxy)benzene, 2,2'-ditrifluoromethyl-4,4'-diaminobiphenyl, 4,4'-bis(4-aminophenoxy)biphenyl, 4,4'-bis(3-aminophenoxy)biphenyl, bis[4-(3-aminophenoxy)phenyl]ketone, bis[4-(3-aminophenoxy)phenyl]sulfide, bis[4-(3-aminophenoxy)phenyl]sulfone, 2,2-bis[4-(3-aminophenoxy)phenyl]propane, 2,2-bis[4-(3-aminophenoxy)phenyl]-1,1,1,3,3,3-hexafluoropropane, m-phenylenediamine, o-phenylenediamine, p-phenylenediamine, m-aminobenzylamine, p-aminobenzylamine, 3,3'-diaminodiphenylether, 3,4'-diaminodiphenylether, 4,4'-diaminodiphenylether, 3,3'-diaminodiphenylsulfide, 3,3'-diaminodiphenylsulfoxide, 3,4'-diaminodiphenylsulfoxide, 4,4'-diaminodiphenylsulfoxide, 3,3'-diaminodiphenylsulfone, 3,4'-diaminodiphenylsulfone, 4,4'-diaminodiphenylsulfone 3,3'-diaminobenzophenone, 3,4'-diaminobenzophenone, 4,4'-diaminobenzophenone, 3,3'-diaminodiphenylmethane, 3,4'-diaminodiphenylmethane, 4,4'-diaminodiphenylmethane, bis[4-(4-aminophenoxy)phenyl]methane, 1,1-bis[4-(4-aminophenoxy)phenyl]ethane, 1,2-bis[4-(4-aminophenoxy)phenyl]ethane, 1,1-bis[4-(4-aminophenoxy)phenyl]propane, 1,2-bis[4-(4-aminophenoxy)phenyl]propane, 1,3-bis[4-(4-aminophenoxy)phenyl]propane, 2,2-bis[4-(4-aminophenoxy)phenyl]propane, 1,1-bis[4-(4-aminophenoxy)phenyl]butane, 1,3-bis[4-(4-aminophenoxy)phenyl]butane, 1,4-bis[4-(4-aminophenoxy)phenyl]butane, 2,2-bis[4-(4-aminophenoxy)phenyl]butane, 2,3-bis[4-(4-aminophenoxy)phenyl]butane, 2-[4-(4-aminophenoxy)phenyl]-2-[4-(4-aminophenoxy)-3-methylphenyl]propane, 2,2-bis[4-(4-aminophenoxy)-3-methylphenyl]propane, 2-[4-(4-aminophenoxy)phenyl]-2-[4-(4-aminophenoxy)-3,5- dimethylphenyl]propane, 2,2-bis[4-(4-aminophenoxy)-3,5-dimethylphenyl]propane, 2,2-bis[4-(4-aminophenoxy)phenyl]-1,1,1,3,3,3-hexafluoropropane, 1,4-bis(3-aminophenoxy)benzene, 1,3-bis(3-aminophenoxy)benzene, 1,4-bis(4-aminophenoxy)benzene, 4,4'-bis(4-aminophenoxy)biphenyl, bis[4-(4-aminophenoxy)phenyl]ketone, bis[4-(4-aminophenoxy)phenyl]sulfide, bis[4-(4-aminophenoxy)phenyl]sulfoxide, bis[4-(4-aminophenoxy)phenyl]sulfone, bis[4-(3-aminophenoxy)phenyl]ether, bis[4-(4-aminophenoxy)phenyl]ether, 1,3-bis[4-(4-aminophenoxy)benzoyl]benzene, 1,3-bis[4-(3-aminophenoxy)benzoyl]benzene, 1,4-bis[4-(3-aminophenoxy)benzoyl]benzene, 4,4'-bis[(3-aminophenoxy)benzoyl]benzene, 1,1-bis[4-(3-aminophenoxy)phenyl]propane, 1,3-bis[4-(3-aminophenoxy)phenyl]propane, 3,4'-diaminodiphenylsulfide, 2,2-bis[3-(3-aminophenoxy)phenyl]-1,1,1,3,3,3-hexafluoropropane, bis[4-(3-aminophenoxy)phenyl]methane, 1,1-bis[4-(3-aminophenoxy)phenyl]ethane, 1,2-bis[4-(3-aminophenoxy)phenyl]ethane, bis[4-(3-aminophenoxy)phenyl]sulfoxide, 4,4'-bis[3-(4-aminophenoxy)benzoyl]diphenylether, 4,4'-bis[3-(3-aminophenoxy)benzoyl]diphenylether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, bis[4-]{4-(4-aminophenoxy)phenoxy}phenyl]sulfone, 1,4-bis[4-(4-aminophenoxy)phenoxy-α,α-dimethylbenzyl]benzene, 1,3-bis[4-(4-aminophenoxy)phenoxy-α,α-dimethylbenzyl]benzene, 1,3-bis[4-(4-amino-6-trifluoromethylphenoxy)-α,α-dimethylbenzyl]benzene, 1,3-bis[4-(4-amino-6-fluorophenoxy)-α,α-dimethylbenzyl]benzene, 1,3-bis[4-(4-amino-6-methylphenoxy)-α,α-dimethylbenzyl]benzene, 1,3-bis[4-(4-amino-6-cyanophenoxy)-α,α-dimethylbenzyl]benzene, 3,3'-diamino-4,4'-diphenoxybenzophenone, 4,4'-diamino-5,5'-diphenoxybenzophenone, 3,4'-diamino-4,5'-diphenoxybenzophenone, 3,3'-diamino-4-phenoxybenzophenone, 4,4'-diamino-5-phenoxybenzophenone, 3,4'-diamino-4-phenoxybenzophenone, 3,4'-diamino-5'-phenoxybenzophenone, 3,3'-diamino-4,4'-dibiphenoxybenzophenone, 4,4'-diamino-5,5'-dibiphenoxybenzophenone, 3,4'-diamino-4,5'-dibiphenoxybenzophenone, 3,3'-diamino-4-biphenoxybenzophenone, 4,4'-diamino-5-biphenoxybenzophenone, 3,4'-diamino-4-biphenoxybenzophenone, 3,4'-diamino-5'-biphenoxybenzophenone, 1,3-bis(3-amino-4-phenoxybenzoyl)benzene, 1,4-bis(3-amino-4-phenoxybenzoyl)benzene, 1,3-bis(4-amino-5-phenoxybenzoyl)benzene, 1,4-bis(4-amino-5-phenoxybenzoyl)benzene, 1,3-bis(3-amino-4-biphenoxybenzoyl)benzene, 1,4-bis(3-amino-4-biphenoxybenzoyl)benzene, 1,3-bis(4-amino-5-biphenoxybenzoyl)benzene, 1,4-bis(4-amino-5-biphenoxybenzoyl)benzene, 2,6-bis[4-(4-amino-α,α-dimethylbenzyl)phenoxy]benzonitrile, aromatic diamine in which a part or all of hydrogen atoms on an aromatic ring of the aromatic diamine are substituted by a halogen atom, an alkyl group or an alkoxyl group having 1 to 3 carbon atoms, a cyano group, or a halogenated alkyl group or an alkoxyl group having 1 to 3 carbon atoms in which a part or all of hydrogen atoms of an alkyl group or an alkoxyl group are substituted with a halogen atom.

As the aliphatic diamines, there are given, for example, 1,2-diaminoethane, 1,4-diaminobutane, 1,5-diaminopentane, 1,6-diaminohexane, 1,8-diaminooctane, and the like.

As the alicyclic diamines, there are given, for example, 1,4-diaminocyclohexane, 4,4'-methylenebis(2,6-dimethylcyclohexylamine), and the like.

The total amount of diamines (aliphatic diamines and alicyclic diamines) other than aromatic diamines is preferably 20% by mass or less, more preferably 10% by mass or less, still more preferably 5% by mass or less of all the diamines. In other words, the aromatic diamines are preferably 80% by mass or more, more preferably 90% by mass or more, still more preferably 95% by mass or more of all the diamines.

As the tetracarboxylic acids constituting the polyamic acid, there can be used aromatic tetracarboxylic acids (including their acid anhydrides), aliphatic tetracarboxylic acids (including their acid anhydrides), and alicyclic tetracarboxylic acids (including their acid anhydrides) which are usually used for polyimide synthesis. Among them, aromatic tetracarboxylic acid anhydrides and alicyclic tetracarboxylic acid anhydrides are preferable. From the viewpoint of heat resistance, aromatic tetracarboxylic acid anhydrides are more preferable, and from the viewpoint of light transmittance, alicyclic tetracarboxylic acids are more preferred. When these are acid anhydrides, the number of anhydride structures in the molecule may be one or two, but those having two anhydride structures (dianhydrides) are preferable. The tetracarboxylic acids may be used alone or in combination of two or more.

As the alicyclic tetracarboxylic acids, there are given, for example, alicyclic tetracarboxylic acids such as a cyclobutane tetracarboxylic acid, a 1,2,4,5-cyclohexane tetracarboxylic acid, a 3,3',4,4'-bicyclohexyl tetracarboxylic acid, and the like, and acid anhydrides thereof. Among these, dianhydrides having two anhydride structures (for example, cyclobutanetetracarboxylic acid dianhydride, 1,2,4,5-cyclohexanetetracarboxylic acid dianhydride, 3,3',4,4'-bicyclohexyltetracarboxylic acid dianhydride, and the like) are suitable. The alicyclic tetracarboxylic acids may be used alone or in combination of two or more.

When importance is placed on transparency, for example, the alicyclic tetracarboxylic acids are preferably 80% by mass or more, more preferably 90% by mass or more, still more preferably 95% by mass or more of all the tetracarboxylic acids.

The aromatic tetracarboxylic acids are not particularly limited, but are preferably pyromellitic acid residues (that is, those having a structure derived from pyromellitic acid), more preferably an acid anhydride thereof. As such aromatic tetracarboxylic acids, there are given, for example, pyromellitic dianhydride, 3,3',4,4'-biphenyltetracarboxylic dianhydride, 4,4'-oxydiphthalic dianhydride, 3,3',4,4'-benzophenonetetracarboxylic dianhydride, 3,3',4,4'-diphenylsulfonetetracarboxylic dianhydride, 2,2-bis[4-(3,4-dicarboxyphenoxy)phenyl]propanoic acid anhydride, and the like. When importance is placed on heat resistance, for example, the aromatic tetracarboxylic acids are preferably 80% by mass or more, more preferably 90% by mass or more, still more preferably 95% by mass or more of all the tetracarboxylic acids.

For application of a polymer solution or a polymer precursor solution on the silane coupling agent layer, there can be used, for example, conventionally known solution application means such as spin coating, doctor blade, applicator, comma coater, a screen printing method, slit coating, reverse coating, dip coating, curtain coating, slit die coating, and the like, as appropriate.

For example, a polyimide resin film can be obtained by performing a thermal imidization method of applying a polyamide acid (polyimide precursor) solution obtained by reacting diamines and tetracarboxylic acids in a solvent on an inorganic substrate to have a predetermined thickness, and, after drying, subjecting it to high-temperature heat treatment to carry out a spin-drying ring-closing reaction or a chemical imidization method using acetic anhydride or the like as a dehydrating agent and using pyridine or the like as a catalyst.

The thickness of the polymer film of the present invention is preferably 3 μm or more, more preferably 11 μm or more, still more preferably 24 μm or more, still more preferably 45 μm or more. The upper limit of the thickness of the polymer film is not particularly limited, but is preferably 250 μm or less, more preferably 150 μm or less, still more preferably 90 μm or less for use as a flexible electronic device.

In the polymer film of the present invention, a glass transition temperature is in the region of 250° C. or higher, preferably 300° C. or higher, more preferably 350° C. or higher, or it is preferable that no glass transition point is observed in the range of 500° C. or lower. The glass transition temperature in the present invention is determined by differential thermal analysis (DSC).

The average CTE between 30° C. to 500° C. of the polymer film of the present invention is preferably −5 ppm/° C. to +20 ppm/° C., more preferably −5 ppm/° C. to +15 ppm/° C., still more preferably 1 ppm/° C. to +10 ppm/° C. When the CTE is in the above-mentioned range, the difference in linear expansion coefficient with a general support (inorganic substrate) can be kept small, and peeling of the polymer film and the inorganic substrate can be avoided even if these are subjected to a process of applying heat.

The tensile breaking strength of the polymer film in the present invention is preferably 60 MPa or more, more preferably 120 MP or more, still more preferably 240 MPa or more. The upper limit of the tensile breaking strength is not particularly limited but is practically less than about 1,000 MPa. In addition, the tensile breaking strength of the polymer film refers to the average value of the tensile breaking strength in the flow direction (MD direction) of the polymer film, and the tensile breaking strength in the width direction (TD direction).

The thickness unevenness of the polymer film in the present invention is preferably 20% or less, more preferably 12% or less, still more preferably 7% or less, particularly preferably 4% or less. When the thickness unevenness exceeds 20%, application to narrow portions tends to be difficult. The thickness unevenness of the film can be determined based on the following equation, for example, by randomly extracting about 10 positions from the film to be measured with a contact-type film thickness meter, and measuring the film thickness.

thickness unevenness of film (%)=100×(maximum film thickness−minimum film thickness)/average film thickness The polymer film in the present invention is preferably obtained in the form of being wound up as a long polymer film having a width of 300 mm or more and a length of 10 m or more at the time of production, and more preferably in a form of a roll-shaped polymer film wound up around a winding core.

In the polymer film, in order to secure the handing ability and productivity, it is preferable that a lubricant (particles) having a particle diameter of about 10 to 1,000 nm be added and contained in the polymer film at about 0.03 to 3% by mass to secure the slipperiness by providing fine unevenness on the polymer film surface.

<Surface Activation Treatment of Polymer Film>

It is preferable to perform surface activation treatment on the polymer film used in the present invention. By subjecting the polymer film to a surface activation treatment, the surface of the polymer film is modified to a state in which a functional group is present (so-called activated state), and the bonding property to an inorganic substrate is improved.

The surface activation treatment in the present invention is dry-type or wet-type surface treatment. As the dry-type surface treatment, there are given, for example, vacuum plasma treatment, atmospheric pressure plasma treatment, treatment of irradiating the surface with active energy rays such as ultraviolet rays, electron beams, and X-rays, corona treatment, flame treatment, itro treatment, and the like. As the wet-type surface treatment, there is given, for example, treatment in which the surface of the polymer film is brought into contact with an acid or an alkaline solution.

In the present invention, a plurality of surface activation treatments may be performed in combination. Such surface activation treatments clean the surface of the polymer film and generate a more active functional group. The generated functional group is linked to the silane coupling agent layer by hydrogen bonding, chemical reaction, or the like, thereby being capable of firmly bonding the polymer film layer and the silane coupling agent layer to each other.

<Pressure and Heat Treatment>

The laminate of the present invention is fabricated by overlaying an inorganic substrate provided with a silane coupling agent layer with the polymer film and subjecting it to pressure and heat treatment.

The pressure and heat treatment may be performed while heating, for example, a press, a laminate, a roll laminate, or the like in an atmospheric pressure or in vacuum. Moreover, a method of performing pressurizing and heating in a state being put in a flexible bag is also applicable. From the viewpoint of improvement in productivity and reduction in processing cost brought about by high productivity, press or roll lamination under an air atmosphere is preferable, and in particular, a method of using a roll (roll laminate or the like) is preferable.

The pressure in the pressure and heat treatment is preferably 1 MPa to 20 MPa, more preferably 3 MPa to 10 MPa. If the pressure is too high, the inorganic substrate may be damaged, and if the pressure is too low, parts that are not in close-contact may be caused, resulting in insufficient bonding. The temperature during the pressure and heat treatment is 150° C. to 400° C., more preferably 250° C. to 350° C. When the polymer film is a polyimide film, if the temperature is too high, the polyimide film may be damaged, and if the temperature is too low, the close-contact tends to be weak.

In addition, although the pressure and heat treatment can be performed in the atmospheric pressure as described above, in order to obtain stable bonding strength of the entire surface, it is preferable to carry out under vacuum. At this time, a degree of vacuum by a normal oil rotary pump is sufficient, and about 10 Torr or less is sufficient.

As an apparatus which can be used for the pressure and heat treatment, for example, "11FD" manufactured by Imoto machinery Co., LTD. can be used for press in vacuum, and, for example, "MVLP" manufactured by MEIKI CO., LTD. can be used for vacuum lamination such as a roll-type film laminator in vacuum or a film laminator which applies a pressure at the same time to the entire surface of the glass with a thin rubber film after evacuation.

The pressure and heat treatment can be performed separately in a pressure process and a heat process. In this case, first, the polymer film and the inorganic substrate are pressurized (preferably about 0.2 to 50 MPa) at a relatively low temperature (for example, a temperature of less than 120° C., more preferably 95° C. or lower) to secure the close-contact between them, and then the polymer film and the inorganic substrate are heated at a relatively high temperature (for example, 120° C. or higher, more preferably 120 to 250° C., more preferably 150 to 230° C.) at low pressure (preferably less than 0.2 MPa, more preferably 0.1 MPa or less) or normal pressure, so that the chemical reaction at the close-contact interface is promoted, and the polymer film and the inorganic substrate can be laminated.

<Bonding Strength>

The surface on which the polymer film is laminated includes an easily-peelable part being a region in which the polymer film can be easily separated from the inorganic substrate together with the silane coupling agent layer when the polymer film is cut and an easily-bondable part being a region in which the polymer film cannot be easily separated therefrom. It is preferable to perform patterning described later on a thin film in order to form the easily-peelable part and the easily-bondable part. When patterning is performed, a part with a thin film becomes an easily-peelable part, and a part without a thin film becomes an easily-bondable part. The bonding strength between the inorganic substrate and the polymer film in the easily-bondable part is two times or more of the bonding strength between the inorganic substrate and the polymer film in the easily-peelable part, preferably three times or more, more preferably fifth times or more. Further, the strength ratio is preferably not less than the multiple and not more than 100 times, more preferably not more than 50 times. In addition, the measuring method of the bonding strength is described later.

If the bonding strength between the inorganic substrate and the polymer film in the easily-bondable part is less than two times the bonding strength between the inorganic substrate and the polymer film in the easily-peelable part, when the polymer film is peeled from the inorganic substrate, it becomes difficult to peel a device formation portion with a low stress by utilizing the difference in bonding strength between the easily-bondable part and the easily-peelable part, which may lower the yield of the flexible electronic device. On the other hand, if the difference in bonding strength between the easily-bondable part and the easily-peelable part is too large, the easily-peelable part may be peeled from the inorganic substrate, or this may be a cause of scum, blister (bulge of the application film), and the like in the easily-peelable part.

The bonding strength of the easily-bondable part is preferably 0.8 N/cm or more, more preferably 1.5 N/cm or more, still more preferably 2.4 N/cm or more, most preferably 3.2 N/cm or more.

The bonding strength of the easily-peelable part is necessarily 0.5 N/cm or less, more preferably less than 0.38 N/cm, still more preferably less than 0.28 N/cm, still more preferably less than 0.18 N/cm, even more preferably less than 0.08 N/cm. Moreover, the bonding strength of the easily-peelable part is preferably 0.003 N/cm or more, more preferably 0.006 N/cm or more. If the bonding strength of the easily-peelable part does not reach a predetermined range, due to the influence of a stress or the like caused on the side of the polymer film or the inorganic substrate during the process, the easily-peelable part may be peeled from the inorganic substrate, or this may be a cause of scum, blister, and the like in the easily-peelable part.

In the present invention, it is preferable that the bonding strength of the easily-peelable part described above is maintained at a sufficiently low state even after heat treatment at 500° C. for 10 minutes is performed. By satisfying these conditions, favorable peelability can be maintained even when high temperatures of 420° C. or higher, preferably 460° C. or higher, more preferably 505° C. or higher are used during the actual processing process.

<Patterning of Thin Film>

The thin film may be continuously formed on the entire surface of the inorganic substrate, but the thin film is preferably formed in a pattern. In the present invention, the part where the thin film is not formed is the easily-bondable part. That is, it is a part in which the polymer film layer remains on the inorganic substrate through the silane coupling agent layer when the inorganic substrate is recycled. Preferably, it is preferable in the thin film that the easily-bondable part surround the easily-peelable part, and hence the thin film is preferably patterned so as to surround the easily-peelable part. The patterning of the thin film layer can be performed by general means such as a general masking method, an etching method using a resist after forming a thin film on the front surface, a lift-off method, or the like.

The pattern shape may be appropriately set according to the type of device to be laminated or the like, and is not particularly limited, and it may be a pattern in which the required device shape is tiled in a single plane or in multiple planes.

By patterning the thin film, the silane coupling agent, and the polymer film layer singly or in combination as described above, the easily-bondable part and the easily-peelable part in which the peel strength between the inorganic substrate and the polymer film is different in the laminate are formed. Thus, it is possible to easily separate the polymer film on which the device is mounted from the inorganic substrate by cutting the polymer film and separating it.

<Method for Producing Flexible Electronic Device>

When the laminate of the present invention is used, an electronic device is formed on the polymer film of the laminate using equipment and processes for manufacturing the existing electronic device, and the entire polymer film is peeled from the laminate, so that a flexible electronic device can be fabricated.

The electronic device in the present invention refers to an electronic circuit including a wiring board having electrical wiring, an active element such as a transistor or a diode, and a passive device such as a resistor, a capacitor, or an inductor, a sensor element sensing pressure, temperature, light, humidity, or the like, image display elements such as a light emitting element, a liquid crystal display, an electrophoretic display, and a self-luminous display, communication elements by wired and wireless communications, an arithmetic element, a storage element, a MEMS element, a solar cell, a thin film transistor, or the like.

In the method of producing a device structure of the present invention, after the device is formed on the polymer film of the laminate fabricated by the method described above, the polymer film in the easily-peelable part of the laminate is cut, and the polymer film is peeled from the inorganic substrate.

As the method of cutting the polymer film in the easily-peelable part of the laminate, there are given a method of cutting the polymer film with a cutting tool such as a knife, a method of cutting the polymer film by scanning the laminate with a laser in a relative manner, a method of cutting the polymer film by scanning the laminate with water jet in a relative manner, a method of cutting the polymer film while slightly cutting to a glass layer with a dicing device for semiconductor chips, and the like, and the method is not particularly limited. For example, in adopting the method described above, it is also possible to appropriately adopt a method such as superimposing an ultrasonic wave on the cutting tool, or adding a reciprocating motion or a vertical motion to improve cutting performance.

The method of peeling the polymer film with the device from the inorganic substrate is not particularly limited, and there are given a method of tucking up the polymer film from the end with a tweezer, or the like, a method of sticking an adhesive tape on one side of the cut portion of the polymer film and then tucking up the polymer film from the tape portion, a method of vacuum-adsorbing one side of the cut portion of the polymer film and then tucking up the polymer film from that portion, and the like. In addition, if bending with a small curvature occurs in the cut portion of the polymer film during peeling, a stress is applied to the portion of the device, and there is a risk that the device may be broken. Thus, it is desirable to peel the film in a state with a large curvature to the extent possible. For example, it is desirable to tuck up the film while winding the film on a roll with a large curvature, or to tuck up the film by using a machine configured such that a roll with a large curvature is located at the peeled part.

Further, it is also useful to employ a method in which another reinforcing substrate is bonded in advance to the part to be peeled off and the film is peeled including the reinforcing substrate. When the flexible electronic device to be peeled is a backplane of a display device, it is possible to bond a frontplane of the display device in advance, and simultaneously peel both after unifying them on an inorganic substrate, to thereby obtain a flexible display device.
<Recycling of Inorganic Substrate>

In the polymer film laminated substrate of the present invention, the inorganic substrate can be reused in such a manner that, after the electronic device is peeled, the remaining polymer film is completely removed from the polymer film laminated substrate, and a simple washing process or the like is performed. This is because the bonding between the thin film and the silane coupling agent layer in the easily-peelable part is uniform and stable, and peeling of the polymer film layer can be performed smoothly, so that almost no peeling residue remains on the inorganic substrate side. This is considered to be because the peeling surface at the time of peeling the polymer film becomes a thin film surface (interface between the thin film and the silane coupling agent layer). For this reason, after the polymer film is peeled, the state in which the thin film is formed on the inorganic substrate (hereinafter, the inorganic substrate in this state is referred to as a thin film laminated inorganic substrate) is maintained.

When the polymer film layer is cut and peeled from the inorganic substrate, the polymer film layer remains on the inorganic substrate in the region where the peeling is not performed. The polymer film layer remaining on the inorganic substrate is required to be removed by an appropriate formulation such as laser peeling or alkali chemical treatment. In the case where the thin film is formed in a pattern, in the part where the polymer film layer is not peeled, when the polymer film layer is removed, the silane coupling agent layer is exposed. However, since a considerable amount is removed not only for the polymer film layer but also for the organic portion of the silane coupling agent layer by the above-mentioned removal, only the inorganic component of the silane coupling agent, that is, the component mainly composed of the silicate glass component remains on the inorganic substrate. Therefore, in the region of the easily-bondable part (region where the thin film was not formed), the surface becomes close to the surface of the inorganic substrate even after removal of the polymer film layer.

Therefore, as in the first formation of the silane coupling agent layer, on the thin film laminated inorganic substrate, a silane coupling agent layer can be formed again to laminate a polymer film layer on the silane coupling agent layer, and as a highly recyclable thin film laminated inorganic substrate, it is possible to form an electronic device by repeating the series of cycles of forming a silane coupling agent layer on the thin film surface, laminating a polymer film layer on the silane coupling agent layer, and after the formation of the electronic device on the polymer film layer, cutting the polymer film and peeling the polymer film layer from the inorganic substrate.

EXAMPLES

The present invention is more specifically described by way of the following examples. However, the present invention is not limited to the following examples, and can be appropriately modified and implemented within the scope of complying with the gist of the descriptions above and below. Those all fall within the technical scope of the present invention.

The evaluation methods of the physical properties in the following examples are as follows.
<Reduced Viscosity of Polyamic Acid Solution>

The solution dissolved in N, N-dimethylacetamide to have a polymer concentration of 0.2 g/dl was measured at 30° C. using a Ubbelohde-type viscosity tube.
<Thickness of Polymer Film>

The thickness of the polymer film was measured using a micrometer ("Millitron 1245D" manufactured by Feinpruf GmbH).
<Thickness Unevenness of Polymer Film>

The thickness unevenness of the polymer film was calculated based on the following formula by extracting 10 points at random from the film to be measured and measuring the film thickness using a micrometer ("Millitron 1245D" manufactured by Feinpruf GmbH) to obtain the maximum value (maximum film thickness), the minimum value (minimum film thickness), and the average value (average film thickness) of the obtained 10 values.

thickness unevenness of film (%)=100×(maximum film thickness−minimum film thickness)/average film thickness <Tensile Modulus, Tensile Breaking Strength, and Tensile Breaking Elongation of Polymer Film>

From a polymer film to be measured, strip test pieces each having a flow direction (MD direction) and a width direction (TD direction) of 100 mm×10 mm were cut out, and using a tensile tester ("Autograph (registered trademark) manufactured by Shimadzu Corporation; model name AG-5000A"), the tensile modulus, the tensile breaking strength, and the tensile breaking elongation were measured for MD direction and TD direction under the condition that tensile speed is 50 mm/min and the distance between the chucks is 40 mm.
<Linear Expansion Coefficient (CTE) of Polymer Film>

For the flow direction (MD direction) and the width direction (TD direction) of the polymer film to be measured, the expansion ratio was measured under the following conditions. The expansion ratio/temperature at the interval at 15° C. (30° C. to 45° C., 45° C. to 60° C., . . . ) was measured, this measurement was performed at up to 500° C., and the average value of all the measured values measured in the MD direction and TD direction was calculated as the linear expansion coefficient (CTE).

Device name: "TMA4000S" manufactured by MAC Science
  Sample length: 20 mm
  Sample width: 2 mm
  Heating start temperature: 30° C.
  Heating end temperature: 500° C.
  Heating rate: 5° C./min
  Atmosphere: argon
  Initial load: 34.5 g/mm$^2$ <Glass Transition Temperature>

The glass transition temperature of the polymer film was determined from the presence or absence of heat absorption/release due to the structural change in the range from room temperature to 500° C. using a DSC differential thermal analyzer. No glass transition temperature was observed for any of the polymer films.

<Evaluation of Polymer Film: Slipperiness>

When two polymer films were overlaid on different surfaces (that is, the wound outer surface and the wound inner surface in the case of being wound as a film roll but not the same surfaces were overlaid), and the overlaid polymer films were pinched with the thumb and forefinger and lightly fitted to each other, the case where the polymer film and the polymer film slip was evaluated as "o" or "excellent", and the case where they did not slip was evaluated as "x" or "defect". In addition, although there is a case where the wound outer surfaces or the wound inner surfaces may not slip, this is not considered as an evaluation item.

<Thickness of Silane Coupling Agent Layer>

Regarding the thickness (nm) of the silane coupling agent layer (SC layer), separately, a sample obtained by coating the silane coupling agent on a cleaned Si wafer and drying it in the same manner as in the respective examples and comparative examples was fabricated, and the film thickness of the silane coupling agent layer formed on the Si wafer was measured by an ellipsometry method using a spectral ellipsometer ("FE-5000" manufactured by Photal) under the following conditions.

Reflection angle range; 45° to 80°
  Wavelength range; 250 nm to 800 nm
  Wavelength resolution; 1.25 nm
  Spot diameter; 1 mm
  tan Ψ; measurement accuracy ±0.01
  cos Δ; measurement accuracy ±0.01
  Measurement; rotation analyzer method
  Polarizer angle; 45°
  Incident angle; fixed at 70°
  Analyzer; 0 to 360° in 11.25° increments
  Wavelength; 250 nm to 800 nm The film thickness was calculated by non-linear least squares fitting. At this time, the model is Air/thin film/Si model, $$n = C3/\lambda 4 + C2/\lambda 2 + C1$$

$$k = C6/\lambda 4 + C5/\lambda 2 + C4$$

The wavelength dependences C1 to C6 were determined by the equation.

<Bonding Strength>

The bonding strength (180 degree peel strength) between the inorganic substrate and the polymer film (polyimide film) of the laminate was measured according to the 180 degree peel method described in JIS C6471 under the following conditions.

Device name: "Autograph (registered trademark) AG-IS" manufactured by Shimadzu Corporation
  Measurement temperature: room temperature
  Peeling speed: 50 mm/min
  Atmosphere: atmospheric air
  Measurement sample width: 10 mm The measurement was carried out immediately after the laminate was fabricated and after heat treatment in an inert oven at 500° C. for 10 minutes.

<Appearance Quality after Heat Treatment>

Heat treatment was performed in an inert oven at 500° C. for 30 minutes, and the appearance quality of the laminate after heat treatment was visually evaluated.

<Production of Polyimide Film>

Production Example 1

(Preparation of Polyamic Acid Solution)

The inside of a reaction vessel equipped with a nitrogen introducing tube, a thermometer, and a stirring rod was replaced with nitrogen, and then 398 parts by mass of 3,3',4,4'-biphenyltetracarboxylic acid dianhydride (BPDA) and 147 parts by mass of para-phenylenediamine (PDA) were added so as to be dissolve in 4600 parts by mass of N,N-dimethylacetamide. As a lubricant, colloidal silica was dispersed into dimethylacetamide to obtain dispersion (Snowtex (registered trademark) DMAC-ST30 manufactured by Nissan Chemical Industries, Ltd.). The dispersion was added so that silica (lubricant) was 0.15% by mass of the total polymer solid content in the polyamic acid solution, and the solution was stirred at a reaction temperature of 25° C. for 24 hours to obtain a brownish viscous polyamic acid solution V1 having the reduced viscosity shown in Table 1.

(Fabrication of Polyimide Film)

The polyamic acid solution V1 obtained above was applied on a smooth surface (non-slip surface) of a long polyester film having a width of 1,050 mm ("A-4100" manufactured by Toyobo Co., Ltd.) using a slit die so that the final film thickness (film thickness after imidization) was 25 μm, and after the solution was dried at 105° C. for 20 minutes, the film was peeled from the polyester film to obtain a self-supporting polyamic acid film having a width of 920 mm.

Then, the obtained self-supporting polyamic acid film was subjected to heat treatment for imidization by raising temperature stepwise by a pin tenter in a temperature range of 150° C. to 420° C. (first stage 180° C.×5 minutes, second stage 270° C.×10 minutes, and third stage 420° C.×5 minutes), and pin holding portions at both ends were removed by slits to obtain a long polyimide film F1 (1,000 m winding) having a width of 850 mm. The characteristics of the obtained film F1 are shown in Table 1.

Production Example 2

(Preparation of Polyamic Acid Solution)

The inside of a reaction vessel equipped with a nitrogen introducing tube, a thermometer, and a stirring rod was replaced with nitrogen, and then 223 parts by mass of 5-amino-2-(p-aminophenyl)benzoxazole (DAMBO), and 4,416 parts by mass of N,N-dimethylacetamide were added and completely dissolved. Then, as a lubricant, the colloidal silica dispersion was added together with 217 parts by mass of pyromellitic dianhydride (PMDA) so that silica (lubricant) was 0.12% by mass of the total polymer solid content in the polyamic acid solution, and the solution was stirred at a reaction temperature of 25° C. for 24 hours to obtain a brownish viscous polyamic acid solution V2 having the reduced viscosity shown in Table 1.

(Fabrication of Polyimide Film)

In place of the polyamic acid solution V1, the polyamic acid solution V2 obtained above was used, and the same operation as in Production Example 1 except that the polyamic acid solution V2 was raised in temperature stepwise in a temperature range of 150° C. to 485° C. by a pin tenter (first stage 150° C.×5 minutes, second stage 220° C.×5 minutes, and third stage 485° C.×10 minutes) was carried out to obtain a long polyimide film F2 (1,000 m winding) having a width of 850 mm. The characteristics of the obtained film F2 are shown in Table 1.

Production Example 3

(Preparation of Polyamic Acid Solution)

The same operation as in Production Example 2 except that the colloidal silica dispersion was not added is carried out to obtain a polyamic acid solution V3.

(Fabrication of Polyimide Film)

The polyamic acid solution V3 obtained above was applied on a smooth surface (non-slip surface) of a long polyester film having a width of 1,050 mm ("A-4100" manufactured by Toyoboseki Co., Ltd.) using a comma coater so that the final film thickness (film thickness after imidization) was about 5 μm. Then, the polyamic acid solution V2 was applied using a slit die so that the final film thickness including V3 was 38 μm, and the solution was dried at 105° C. for 25 minutes. After that, the film was peeled from the polyester film to obtain a self-supporting polyamic acid film having a width of 920 mm.

Then, the obtained self-supporting polyamic acid film was subjected to heat treatment for imidization by raising temperature stepwise by a pin tenter in a temperature range of 180° C. to 495° C. (first stage 180° C.×5 minutes, second stage 220° C.×5 minutes, and third stage 495° C.×10 minutes), and pin holding portions at both ends were removed by slits to obtain a long polyimide film F3 (1,000 m winding) having a width of 850 mm. The characteristics of the obtained film F3 are shown in Table 1.

TABLE 1

| Polyamic Acid Solution | | | V1 | V2 | V3 |
|---|---|---|---|---|---|
| Tetracarboxylic Acid | PMDA | Parts by Mass | — | 217 | 217 |
| | BPDA | | 398 | — | — |
| Diamines | PDA | | 147 | — | — |
| | DAMBO | | — | 223 | 223 |
| Silica | | % by Mass | 0.15 | 0.12 | 0.00 |
| Reduced Viscosity | | ηsp/c | 3.8 | 3.5 | 3.5 |

| | | Production Example 1 | Production Example 2 | Production Example 3 |
|---|---|---|---|---|
| Polyimide Film | | F1 | F2 | F3 |
| Polyamic Acid Solution | | V1 | V2 | V2/V3 |
| Film Thickness | μm | 25 | 25 | 38 |
| Film Thickness Unevenness | % | 1.7 | 1.0 | 1.1 |
| CTE | ppm/° C. | 11.0 | 2.5 | 2.1 |
| Tensile Modulus (MD/TD) | GPa | 9.8/9.4 | 8.4/8.6 | 8.2/8.5 |
| Tensile Breaking Strength (MD/TD) | MPa | 340/320 | 380/390 | 370/370 |
| tensile breaking elongation (MD/TD) | % | 47/52 | 42/40 | 34/33 |
| Slipperiness | — | ○ | ○ | ○ |

<Plasma Treatment of Film>

The polyimide film was cut into a predetermined size and treated with a sheet-fed vacuum plasma device. As the vacuum plasma treatment, processing by the RIE mode using parallel plate-type electrodes and the RF plasma were adopted, nitrogen gas was introduced into a vacuum chamber, high frequency power of 13.54 MHz is introduced, and the processing time was 3 minutes.

<Formation Example 1 of Aluminum Oxide Layer>

The inorganic substrate was ultrasonically cleaned using ultrapure water and thoroughly dried by dry air through a HEPA filter. Next, the dried inorganic substrate was set in a chamber of a magnetron sputtering apparatus having a gas introduction mechanism and a shutter, the surface of the inorganic substrate was masked by an aluminum mask having a plurality of openings of 50 mm×80 mm at an interval of 12 mm between the openings, argon gas was introduced into the chamber at 15 mTorr, and magnetron sputtering with application of RF power of 13.54 MHz was performed for 5 seconds using a metal aluminum target, so that an aluminum thin film AL1 was formed on the surface of the inorganic substrate.

In addition, the film thickness of the aluminum thin film obtained by performing sputtering for 120 seconds under the same conditions in advance was measured with a stylus-type step profiler, and the film thickness was 405 nm. Since the relationship between the sputtering time and the deposition rate was known to be approximately linear, the thickness of the aluminum thin film obtained in 5 seconds was estimated to be 16.9 nm by proportional calculation.

Next, after the aluminum thin film was formed, the inside of the chamber was replaced with oxygen gas, and reverse sputtering was performed for 10 seconds in a state where oxygen gas flowed so that the inside of the chamber became 30 mTorr to oxidize the surface of the aluminum thin film, so that an aluminum oxide film was formed.

<Formation Example 2 of Aluminum Oxide Layer>

The inorganic substrate was ultrasonically cleaned using ultrapure water and thoroughly dried by dry air through a HEPA filter. Next, the dried inorganic substrate was set in a chamber of a magnetron sputtering apparatus having a gas introduction mechanism and a shutter, the surface of the inorganic substrate was masked by an aluminum mask having a plurality of openings of 50 mm×80 mm at an interval of 12 mm between the openings, oxygen gas was introduced into the chamber at 20 mTorr, and magnetron sputtering with application of RF power of 13.54 MHz was performed for 15 seconds using a metal aluminum target, so that an aluminum oxide thin film AL2 was formed on the surface of the inorganic substrate.

In addition, sputtering for 240 seconds was performed under the same conditions in advance, and the obtained film thickness was measured with a stylus-type step profiler. The film thickness was 170 nm. Since the relationship between the sputtering time and the deposition rate was known to be approximately linear, the thickness of the aluminum thin film obtained in 15 seconds was estimated to be 10.6 nm by proportional calculation.

<Formation Example 3 of Aluminum Oxide Layer>

The inorganic substrate was ultrasonically cleaned using ultrapure water and thoroughly dried by dry air through a HEPA filter. Next, the dried inorganic substrate is set in an ion gun apparatus manufactured by Advanced Energy, and the surface of the inorganic substrate was masked by an aluminum mask having a plurality of openings of 50 mm×80 mm at an interval of 12 mm between the openings, the inside of the discharge chamber was covered with an aluminum plate, and oxygen gas was flowed in the chamber at 45 sccm, ion irradiation was performed with power of 300 W, so that an aluminum oxide thin film AL3 was formed on the inorganic substrate.

<Formation Example 4 of Aluminum Oxide Layer>

The inorganic substrate was ultrasonically cleaned using ultrapure water and thoroughly dried by dry air through a HEPA filter. Next, similarly to Formation Example 1, the dried inorganic substrate was set in a chamber of a magnetron sputtering apparatus having a gas introduction mechanism and a shutter, the surface of the inorganic substrate was masked by an aluminum mask having a plurality of openings of 50 mm×80 mm at an interval of 12 mm between the openings, argon gas was introduced into the chamber at 15 mTorr, and magnetron sputtering with application of RF power of 13.54 MHz was performed for 5 seconds using a metal aluminum target, so that an aluminum thin film AL4 was formed on the surface of the inorganic substrate.

Next, the obtained inorganic substrate with the aluminum thin film was set in an atmospheric pressure plasma device manufactured by Sekisui Chemical Co., Ltd., and atmospheric pressure plasma treatment was performed in air (gas:air) to oxidize the aluminum thin film, so that an aluminum oxide thin film was formed.

<Formation Example 1 of Composite Oxide Film of Aluminum and Silicon>

The inorganic substrate was ultrasonically cleaned using ultrapure water and thoroughly dried by dry air through a HEPA filter. Next, the dried inorganic substrate was set in a magnetron sputtering apparatus with two targets having a gas introduction mechanism and a shutter, the surface of the inorganic substrate was masked by an aluminum mask having a plurality of openings of 50 mm×80 mm at an interval of 12 mm between the openings, argon gas was flowed in the sputtering chamber so that the internal pressure of the chamber was 10 mTorr, and magnetron sputtering with application of RF power using metal aluminum and silicon dioxide targets was performed for 10 seconds, so that a complex oxide thin film AS1 of aluminum and silicon was obtained. The applied power to the aluminum target was 30 w, and the applied power to the silicon dioxide target was 60 W. The composition of the obtained composite oxide thin film of aluminum and silicon was measured by fluorescent X-ray, and as a result, the ratio of aluminum to silicon was 71:29 (elemental ratio).

As a result of performing thin film deposition for 600 seconds under the same conditions in advance, it was confirmed that the film thickness was 587 nm with a stylus-type step profiler, and the deposited film thickness was estimated to be 9.8 nm even for 10 seconds.

<Formation Example 2 of Composite Oxide Film of Aluminum and Silicon>

In Formation Example of the complex oxide film of aluminum and silicon, the thin film was formed under the same conditions except that the applied power to the aluminum target was 30 w and the applied power to the silicon dioxide target was 100 w, so that a thin film AS2 of a composite oxide of aluminum and silicon with the ratio of aluminum to silicon 52:48 (elemental ratio) was obtained.

In addition, a thin film deposition experiment for 600 seconds was performed in advance and the thickness was measured with a stylus-type step profiler. The thickness was 873 nm, and hence the deposited film thickness for 10 seconds was estimated to be 14.6 nm.

<Formation Example 3 of Composite Oxide Film of Aluminum and Silicon>

In Formation Example of the complex oxide film of aluminum and silicon, the thin film was formed under the same conditions except that the applied power to the aluminum target was 30 w and the applied power to the silicon dioxide target was 150 w. A thin film AS3 of a composite oxide of aluminum and silicon in which the ratio of aluminum to silicon is 37:63 (elemental ratio) was obtained.

In addition, a thin film deposition experiment for 600 seconds was performed in advance and the thickness was measured with a stylus-type step profiler. The thickness was 1,134 nm, and hence the deposited film thickness for 10 seconds was estimated to be 18.9 nm.

<Formation Example 1 of Metal Thin Film>

The inorganic substrate was ultrasonically cleaned using ultrapure water and thoroughly dried by dry air through a HEPA filter. Next, the dried inorganic substrate was set in a chamber of a magnetron sputtering apparatus having a gas introduction mechanism and a shutter, the surface of the inorganic substrate was masked by an aluminum mask having a plurality of openings of 50 mm×80 mm at an interval of 12 mm between the openings, argon gas was introduced into the chamber at 5 mTorr, and sputtering with application of DC power was performed for 10 seconds using a metal molybdenum target, so that a molybdenum thin film MO1 was formed on the surface of the inorganic substrate.

In addition, the film thickness of the aluminum thin film obtained by performing sputtering for 600 seconds under the same conditions in advance was measured with a stylus-type step profiler, and the film thickness was 582 nm. Since the relationship between the sputtering time and the deposition rate was known to be approximately linear, the thickness of the molybdenum thin film obtained in 10 seconds was estimated to be 9.7 nm by proportional calculation.

<Formation Example 2 of Metal Thin Film>

The inorganic substrate was ultrasonically cleaned using ultrapure water and thoroughly dried by dry air through a HEPA filter. Next, the dried inorganic substrate was set in a chamber of a magnetron sputtering apparatus having a gas introduction mechanism and a shutter, the surface of the inorganic substrate was masked by an aluminum mask having a plurality of openings of 50 mm×80 mm at an interval of 12 mm between the openings, argon gas was introduced into the chamber at 5 mTorr, and sputtering with application of DC power was performed for 30 seconds using a metal tungsten target, so that a tungsten thin film W1 was formed on the surface of the inorganic substrate.

In addition, sputtering for 3,600 seconds was performed under the same conditions in advance, and the obtained film thickness was measured with a stylus-type step profiler. The film thickness was 407 nm. Since the relationship between the sputtering time and the deposition rate was known to be approximately linear, the thickness of the tungsten thin film obtained in 30 seconds was estimated to be 3.4 nm by proportional calculation.

<Formation Example 3 of Metal Thin Film>

The inorganic substrate was ultrasonically cleaned using ultrapure water and thoroughly dried by dry air through a HEPA filter. Next, the dried inorganic substrate was set in a chamber of a magnetron sputtering apparatus having a gas introduction mechanism and a shutter, the surface of the inorganic substrate was masked by an aluminum mask having a plurality of openings of 50 mm×80 mm at an interval of 12 mm between the openings, argon gas was introduced into the chamber at 5 mTorr, and sputtering with application of DC power was performed for 30 seconds in a state where metal molybdenum chips are placed on a metal tungsten target, so that an alloy thin film MW1 of molybdenum and tungsten was formed on the surface of the inorganic substrate.

In addition, sputtering for 3,600 seconds was performed under the same conditions in advance, and the obtained film thickness was measured with a stylus-type step profiler. The film thickness was 523 nm. Since the relationship between the sputtering time and the deposition rate was known to be approximately linear, the thickness of the tungsten thin film obtained in 30 seconds was estimated to be 4.4 nm by proportional calculation. Further, the ratio of the alloy of molybdenum to tungsten determined by a fluorescent X-ray was molybdenum:tungsten=14:86 (elemental ratio).

<Formation of Silane Coupling Agent Layer on Inorganic Substrate>

Application Example 1 (Spin Coating Method)

As a silane coupling agent, a silane coupling agent diluted solution in which 3-aminopropyltrimethoxysilane ("KBM-903" manufactured by Shin-Etsu Chemical Co., Ltd.) was diluted by 0.5% by mass with isopropyl alcohol was prepared. The inorganic substrate was placed in a spin coater manufactured by Japan Create, 70 ml of isopropyl alcohol is dropped onto the center of rotation, and the solution was shaken off and dried at 500 rpm. Subsequently, approximately 35 ml of the silane coupling agent diluted solution was dropped onto the center of rotation, the substrate was first rotated at 500 rpm for 10 seconds. Then, the rotational speed was increased to 1,500 rpm, and the substrate was rotated for 20 seconds to shake off the silane coupling agent diluted solution. Next, the inorganic substrate in which the silane coupling agent was applied was placed on a hot plate heated to 100° C. placed in a clean bench so that the silane coupling agent application surface faces upward, and the substrate was heated for about 3 minutes to obtain a silane coupling agent spin coat application substrate.

Application Example 2 (Gas Phase Application Method)

The silane coupling agent was applied to the inorganic substrate under the following conditions using a vacuum chamber having a hot plate. 100 parts by mass of a silane coupling agent ("KBM-903" manufactured by Shin-Etsu Chemical Co., Ltd.: 3-aminopropyltrimethoxysilane) was filled in a petri dish and left on the hot plate. At this time, the hot plate temperature was 25° C. Next, the inorganic substrate was held horizontally so that the thin film surface faces downward at a position 300 mm away from the liquid surface of the silane coupling agent in the vertical direction, the vacuum chamber was closed, and nitrogen gas was introduced up to a point where the oxygen concentration becomes 0.1 volume % or less at atmospheric pressure. Subsequently, the introduction of nitrogen gas was stopped, the pressure in the chamber was reduced to $3\times10^{-4}$ Pa, the hot plate temperature was raised to 120° C., and after the substrate was held for 10 minutes, exposure to the silane coupling agent vapor was performed. Thereafter, the temperature of the hot plate was lowered. At the same time, clean nitrogen gas was gently introduced into the vacuum chamber to return to atmospheric pressure, and the glass plate was taken out. The substrate was placed on the hot plate at 100° C. in a clean environment so that the silane coupling agent application surface faces upward, and heat treatment was performed for about 3 minutes to obtain a silane coupling agent gas phase application substrate.

Examples 1 to 16

<Fabrication of Laminate and Evaluation of Initial Characteristics>

An aluminum oxide layer according to Formation Example 1 of an aluminum oxide layer was formed using soda glass of 370 mm×470 mm and a thickness of 1.1 mm as an inorganic substrate, and silane coupling agent treatment was further performed on the aluminum oxide layer side by a spin coating method.

Next, the substrate was cut into a size of 380 mm×480 mm, and was temporarily laminated using a laminator (SE650 nH manufactured by Climb Products co., ltd.) so that the plasma treatment surface of the polyimide film F1 subjected to plasma treatment overlapped the silane coupling agent treatment surface of the inorganic substrate. The lamination conditions were such that temperature on the inorganic substrate side was 100° C., roll pressure at lamination was 5 kg/cm², and roll speed was 5 mm/sec. The polyimide film after the temporary lamination did not peel off under its own weight, but it had such a bonding property that it could be easily peeled when the end of the film was scratched. Thereafter, the obtained temporary-laminate laminated substrate was placed in a clean oven, then heated at 200° C. for 30 minutes, and allowed to cool to room temperature to obtain a polymer film laminated substrate. The characteristics of the obtained laminated substrate are shown in Table 2. Here, the easily-peelable part corresponds to a portion where the aluminum oxide layer is formed, and the easily-bondable part corresponds to a portion where the aluminum oxide layer is not formed by masking.

In the following, in the same manner as in Example 1, the laminate was fabricated by appropriately changing the conditions such as the inorganic substrate, the thin film formation method, the polyimide film, the silane coupling agent application method, and whether or not the plasma treatment of the polyimide film is performed, and the characteristics were evaluated. The results are shown in Table 2, Table 3, and Table 4.

TABLE 2

| Inorganic Substrate | Example 1 Glass | | Example 2 Glass | | Example 3 Glass | | Example 4 Wafer | | Example 5 Wafer | |
| --- | --- | --- | --- | --- | --- | --- | --- | --- | --- | --- |
| | Easily-peelable Part | Easily-bondable Part | Easily-peelable Part | Easily-bondable Part | Easily-peelable Part | Easily-bondable Part | Easily-peelable Part | Easily-bondable Part | Easily-peelable Part | Easily-bondable Part |
| Aluminum Oxide Thin Film Layer | Present | Absent | Present | Absent | Present | Absent | Present | Absent | Present | Absent |
| Formation Example of Aluminum Oxide Thin Film Layer | AL1 | | AL1 | | AL1 | | AL1 | | AL1 | |

TABLE 2-continued

|  |  | Example 1 Glass | | Example 2 Glass | | Example 3 Glass | | Example 4 Wafer | | Example 5 Wafer | |
| --- | --- | --- | --- | --- | --- | --- | --- | --- | --- | --- | --- |
| Inorganic Substrate |  | Easily-peelable Part | Easily-bondable Part | Easily-peelable Part | Easily-bondable Part | Easily-peelable Part | Easily-bondable Part | Easily-peelable Part | Easily-bondable Part | Easily-peelable Part | Easily-bondable Part |
| Application of Silane Coupling Agent |  | Spin Coating | | Spin Coating | | Spin Coating | | Spin Coating | | Spin Coating | |
| Film |  | V1 | | V2 | | V3 Non-slip Surface | | V3 Non-slip Surface | | V3 Non-slip Surface | |
| Plasma Treatment on Film |  | Performed | | Performed | | Performed | | Performed | | Not Performed | |
| Initial Peel Strength | N/cm | 0.25 | 3.21 | 0.21 | 3.65 | 0.31 | 3.26 | 0.19 | 2.54 | 0.12 | 1.42 |
| Peel Strength after Heat Treatment at 500° C. | N/cm | 0.27 | 4.54 | 0.24 | 4.32 | 0.33 | 4.27 | 0.25 | 4.65 | 0.15 | 1.28 |
| Appearance after Treatment at 500° C. for 30 Minutes | Visual Observation | Favorable | | Favorable | | Favorable | | Favorable | | Favorable | |

TABLE 3

|  |  | Example 6 Glass | | Example 7 Glass | | Example 8 Glass | | Example 9 Wafer | | Example 10 Wafer | |
| --- | --- | --- | --- | --- | --- | --- | --- | --- | --- | --- | --- |
| Inorganic Substrate |  | Easily-peelable Part | Easily-bondable Part | Easily-peelable Part | Easily-bondable Part | Easily-peelable Part | Easily-bondable Part | Easily-peelable Part | Easily-bondable Part | Easily-peelable Part | Easily-bondable Part |
| $Al_2O_3$ Thin Film Layer |  | Present | Absent | Present | Absent | Present | Absent | Present | Absent | Present | Absent |
| Formation Example of Aluminum Oxide Thin Film Layer |  | AL1 | | AL1 | | AL1 | | AL1 | | AL1 | |
| Application of Silane Coupling Agent |  | Gas Phase Coating | | Gas Phase Coating | | Gas Phase Coating | | Gas Phase Coating | | Gas Phase Coating | |
| Film |  | V1 | | V2 | | V3 Non-slip Surface | | V3 Non-slip Surface | | V3 Non-slip Surface | |
| Plasma Treatment on Film |  | Performed | | Performed | | Performed | | Performed | | Not Performed | |
| Initial Peel Strength | N/cm | 0.19 | 2.52 | 0.18 | 2.85 | 0.25 | 2.68 | 0.16 | 2.02 | 0.10 | 1.31 |
| Peel Strength after Heat Treatment at 500° C. | N/cm | 0.24 | 3.52 | 0.17 | 3.16 | 0.29 | 3.33 | 0.22 | 4.10 | 0.12 | 1.07 |
| Appearance after Treatment at 500° C. for 30 Minutes | Visual Observation | Favorable | | Favorable | | Little Scum | | Favorable | | Favorable | |

TABLE 4

|  | Example 11 Wafer | | Example 12 Wafer | | Example 13 Wafer | | Example 14 Wafer | | Example 15 Wafer | | Example 16 Wafer | |
| --- | --- | --- | --- | --- | --- | --- | --- | --- | --- | --- | --- |
| Inorganic Substrate | Easily-peelable Part | Easily-bondable Part | Easily-peelable Part | Easily-bondable Part | Easily-peelable Part | Easily-bondable Part | Easily-peelable Part | Easily-bondable Part | Easily-peelable Part | Easily-bondable Part | Easily-peelable Part | Easily-bondable Part |
| $Al_2O_3$ | Present | Absent | Present | Absent | Present | Absent | Present | Absent | Present | Absent | Present | Absent |
| Formation Example of Aluminum Oxide Thin Film Layer | AL2 | | AL3 | | AL4 | | AL2 | | AL3 | | AL4 | |
| Application of Silane Coupling Agent | Gas Phase Coating | | Gas Phase Coating | | Gas Phase Coating | | Gas Phase Coating | | Gas Phase Coating | | Gas Phase Coating | |
| Film | V3 Non-slip Surface | | V3 Non-slip Surface | | V3 Non-slip Surface | | V3 Non-slip Surface | | V3 Non-slip Surface | | V3 Non-slip Surface | |

TABLE 4-continued

|  |  | Example 11 Wafer | | Example 12 Wafer | | Example 13 Wafer | | Example 14 Wafer | | Example 15 Wafer | | Example 16 Wafer | |
|---|---|---|---|---|---|---|---|---|---|---|---|---|---|
| Inorganic Substrate | | Easily-peel-able Part | Easily-bond-able Part | Easily-peel-able Part | Easily-bond-able Part | Easily-peel-able Part | Easily-bond-able Part | Easily-peel-able Part | Easily-bond-able Part | Easily-peel-able Part | Easily-bond-able Part | Easily-peel-able Part | Easily-bond-able Part |
| Plasma Treatment on Film | | Performed | | Performed | | Performed | | Performed | | Performed | | Performed | |
| Initial Peel Strength | N/cm | 0.08 | 2.25 | 0.08 | 3.26 | 0.07 | 3.26 | 0.08 | 2.22 | 0.07 | 2.43 | 0.08 | 1.24 |
| Peel Strength after Heat Treatment at 500° C. | N/cm | 0.09 | 2.86 | 0.09 | 3.87 | 0.09 | 3.79 | 0.11 | 2.83 | 0.10 | 2.84 | 0.09 | 1.81 |
| Appearance after Treatment at 500° C. for 30 Minutes | Visual Observation | Favorable | | Favorable | | Favorable | | Favorable | | Favorable | | Favorable | |

As "glass" in the tables, soda glass of 370 mm×470 mm and a thickness of 1.1 mm was used, and as "wafer" in the tables, a silicon single crystal wafer of 8 inches and a thickness of 0.7 mm was used. "F3 non-slip surface" is the side of the film F3 using the polyamic acid V3.

Application Example 1

Using the laminate obtained in Example 8, a thin film transistor array having a bottom gate-type structure on a polyimide film was fabricated on the easily-peelable part by the following steps.

A gas barrier film of 100 nm made of SiON was formed on the entire surface of the laminate on the polyimide film side by a reactive sputtering method. Next, an aluminum layer having a thickness of 80 nm was formed by a sputtering method, and a gate wiring and a gate electrode were formed by a photolithographic method. Subsequently, an epoxy resin-based gate insulating film (thickness of 80 nm) was formed using a slit die coater. Furthermore, a Cr layer of 5 nm and a gold layer of 40 nm were formed by a sputtering method, and a source electrode and a drain electrode were formed by a photolithographic method. In addition, a slit die coater was used to apply an epoxy resin to be an insulating layer and a dam layer, a dam layer having a thickness of 250 nm for a semiconductor layer including a source electrode and a drain electrode was formed to be a circle with a diameter of 100 μm by ablation using a UV-YAG laser, and at the same time, formation of a via to be a connection point with the upper electrode was performed. Then, polythiophene, which is an organic semiconductor, was discharged into a dam by an ink jet printing method, silver paste was embedded in the via portion, and aluminum wiring was formed as an upper electrode to form a thin film transistor array having 640×480 pixels.

The obtained thin film transistor array was used as a backplane, and an electrophoretic display medium was overlaid on a frontplane to obtain a display element. The yield of the transistor and the display performance were judged by ON/OFF of each pixel. As a result, in the thin film transistor array fabricated using any of the laminates, the display performance was excellent in all cases.

In addition, after the frontplane was overlaid on the thin film transistor array, the polymer film portion was burnt out with a UV-YAG laser along about 0.5 mm inside from the outer periphery of the thin film pattern, and peeling was performed so as to scooped up using a thin razor blade from the end of the cut to obtain a flexible electrophoretic display. The obtained electrophoretic display exhibited excellent display characteristics, and no deterioration in performance was observed even when the display was wound around a round bar of 5 mmφ.

Application Example 2

After the flexible electrophoretic display device is peeled in Application Example 1, the inorganic substrate was immersed in a 10% aqueous solution of sodium hydroxide at room temperature for 20 hours. After that, washing with water was performed, further, cleaning was performed with a glass washing device for a liquid crystal substrate, and after drying, UV ozone washing was performed for 3 minutes. Thereafter, the process returned to the above-mentioned step: <formation of silane coupling agent layer on inorganic substrate>, and in the subsequent steps, a laminate was obtained by performing the same fabrication method as that of fabricating the laminate first. The quality of the obtained laminate was excellent, and it was in a state where recycle use was satisfactory possible.

Application Example 3

The laminate obtained in Example 1 was covered with a stainless steel frame having an opening and fixed to a substrate holder in a sputtering apparatus. The substrate holder and a support of the laminate were fixed in close-contact with each other, and refrigerant was allowed to flow in the substrate holder so that the temperature of the laminate could be set, and the temperature of the laminate was set to 2° C. First, plasma treatment was performed on a polyimide film surface of the laminate. The plasma treatment conditions were such that a frequency was 13.56 MHz, an output was 200 W, and a gas pressure was $1 \times 10^{-3}$ Torr in argon gas, the temperature at the time of processing was 2° C., and the processing time was 2 minutes. Then, under the conditions that the frequency was 13.56 MHz, the output was 450 W, and the gas pressure was $3 \times 10^{-3}$ Torr, a target of a nickel-chromium (Cr 10 mass %) alloy was used, and by a DC magnetron sputtering method under an argon atmosphere, a nickel-chromium alloy film (base layer) having a thickness of 11 nm was formed at a rate of 1 nm/sec. Next, the temperature of the laminate was set to 2° C., and sputtering was performed. Then, copper was deposited at a rate of 10 nm/sec to form a copper thin film having a thickness of 0.22 μm. In this manner, a laminate sheet with a base metal thin film formation film was obtained from each laminate. The thicknesses of the copper and a NiCr layer were confirmed by a fluorescent X-ray method.

Next, the laminate sheet with the base metal thin film formation film was fixed to a frame made of Cu and was immersed in an electrolytic plating solution (copper sulfate 80 g/l, sulfuric acid 210 g/l, HCl, small amount of brightener) using a copper sulfate plating bath, and 1.5 A/dm$^2$ of electricity is allowed to flow to form a thick copper plating layer (thick layer) having a thickness of 4 μm. Subsequently, heat treatment was performed at 120° C. for 10 minutes for drying to form a copper foil layer on the polymer film surface of the laminate.

A photoresist ("FR-200" manufactured by Shipley Co., Ltd.) was applied to the obtained copper foil layer and dried, then exposed with a glass photomask for off-contact exposure, and developed with a 1.2 mass % KOH aqueous solution. Next, etching was performed with a cupric chloride etching line containing HCl and hydrogen peroxide at a spray pressure of 2 kgf/cm$^2$ at 40° C. to form a line array of line/space=20 μm/20 μm as a test pattern. Next, electroless tin plating was performed to a thickness of 0.5 μm, and annealing treatment was performed at 125° C. for 1 hour to obtain a wiring pattern.

The obtained wiring pattern was observed with an optical microscope, and a test pattern was used to check the presence or absence of disconnection/short circuit. As a result, there were no disconnections or short circuits in any wiring pattern, and the pattern shape was also excellent. Next, the polymer film was peeled from the glass plate by the same method as in Application Example 1 to obtain a flexible wiring substrate. The flexibility of the obtained flexible wiring board was excellent.

Application Example 4

Using the laminate obtained in Example 8, by the following steps, a tungsten film (film thickness of 75 nm) was formed on a polyimide film by a vacuum vapor deposition method, and an oxidized silicon film (film thickness of 150 nm) was formed to be laminated as an insulating film without being exposed to the atmospheric air. Next, a silicon oxynitride film (film thickness of 100 nm) to be a base insulating film was formed by a plasma CVD method, and an amorphous silicon film (film thickness of 54 nm) was formed to be laminated without being exposed to the atmospheric air.

Then, the hydrogen element of the amorphous silicon film was removed to promote crystallization, and heat treatment at 510° C. was performed for 10 minutes to form a polysilicon film.

A TFT element was fabricated using a portion in the easily-peelable part of the obtained polysilicon film. First, the polysilicon thin film was patterned to form a silicon region having a predetermined shape, and as appropriate, formation of a gate insulating film, formation of a gate electrode, formation of a source region or a drain region by doping to an active region, formation of an interlayer insulating film, formation of a source electrode and a drain electrode, and activation treatment were performed to fabricate an array of P-channel TFTs using polysilicon.

The polymer film portion was burnt out with a UV-YAG laser along about 0.5 mm inside from the outer periphery of the thin TFT array, and peeling was performed so as to scooped up using a thin razor blade from the end of the cut to obtain a flexible TFT array. Peeling was possible with minimal force, and peeling without damaging the TFTs was possible. The obtained flexible TFT array did not exhibited any deterioration in performance even when wound around a round bar of 3 mmφ, and maintained excellent characteristics.

Examples 17 to 30

The same operation as in Example 1 except that the thin films obtained in Formation Examples 1 to 3 of the complex oxide film of aluminum and silicon were used as a thin film was carried out to obtain a laminated substrate. Furthermore, evaluation in the same manner was carried out. The results are shown in Table 5, Table 6, and Table 7.

TABLE 5

| Inorganic Substrate | | Example 17 Glass | | Example 18 Glass | | Example 19 Glass | | Example 20 Wafer | | Example 21 Wafer | |
|---|---|---|---|---|---|---|---|---|---|---|---|
| | | Easily-peelable Part | Easily-bondable Part | Easily-peelable Part | Easily-bondable Part | Easily-peelable Part | Easily-bondable Part | Easily-peelable Part | Easily-bondable Part | Easily-peelable Part | Easily-bondable Part |
| Composite Oxide Film Layer or Aluminum-Silicon | | Present | Absent | Present | Absent | Present | Absent | Present | Absent | Present | Absent |
| Formation Example of Aluminum Oxide Thin Film Layer | | AS1 | | AS1 | | AS1 | | AS1 | | AS1 | |
| Application of Silane Coupling Agent | | Spin Coating | | Spin Coating | | Spin Coating | | Spin Coating | | Spin Coating | |
| Film | | F1 | | F2 | | F3 Non-slip Surface | | F3 Non-slip Surface | | F3 Non-slip Surface | |
| Plasma Treatment on Film | | Performed | | Performed | | Performed | | Performed | | Not Performed | |
| Initial Peel Strength | N/cm | 0.29 | 3.08 | 0.25 | 3.40 | 0.34 | 3.10 | 0.22 | 2.46 | 0.15 | 1.29 |
| Peel Strength after Heat Treatment at 500° C. for 10 Minutes | N/cm | 0.30 | 4.10 | 0.27 | 3.91 | 0.38 | 3.88 | 0.31 | 4.56 | 0.17 | 1.18 |
| Appearance after Treatment at 500° C. for 30 Minutes | Visual Observation | Favorable | | Favorable | | Favorable | | Favorable | | Favorable | |

TABLE 6

| Inorganic Substrate | | Example 22 Glass | | Example 23 Glass | | Example 24 Glass | | Example 25 Wafer | | Example 26 Wafer | |
|---|---|---|---|---|---|---|---|---|---|---|---|
| | | Easily-peelable Part | Easily-bondable Part | Easily-peelable Part | Easily-bondable Part | Easily-peelable Part | Easily-bondable Part | Easily-peelable Part | Easily-bondable Part | Easily-peelable Part | Easily-bondable Part |
| Composite Oxide Film Layer of Aluminum-Silicon | | Present | Absent | Present | Absent | Present | Absent | Present | Absent | Present | Absent |
| Formation Example of Aluminum Oxide Thin Film Layer | | AS1 | | AS1 | | AS1 | | AS1 | | AS1 | |
| Application of Silane Coupling Agent | | Gas Phase Coating | | Gas Phase Coating | | Gas Phase Coating | | Gas Phase Coating | | Gas Phase Coating | |
| Film | | F1 | | F2 | | F3 Non-slip Surface Performed | | F3 Non-slip Surface Performed | | F3 Non-slip Surface Performed | |
| Plasma Treatment on Film | | Performed | | Performed | | | | | | | |
| Initial Peel Strength | N/cm | 0.22 | 2.42 | 0.22 | 2.81 | 0.28 | 2.43 | 0.19 | 1.95 | 0.11 | 1.24 |
| Appearance after Treatment at 500° C. for 10 Minutes | N/cm | 0.29 | 3.48 | 0.20 | 2.88 | 0.32 | 3.21 | 0.25 | 3.92 | 0.14 | 1.02 |
| Appearance after Treatment at 500° C. for 30 Minutes | Visual Observation | Favorable | | Favorable | | Favorable | | Favorable | | Favorable | |

TABLE 7

| Inorganic Substrate | | Example 27 Glass | | Example 28 Glass | | Example 29 Wafer | | Example 30 Wafer | |
|---|---|---|---|---|---|---|---|---|---|
| | | Easily-peelable Part | Easily-bondable Part | Easily-peelable Part | Easily-bondable Part | Easily-peelable Part | Easily-bondable Part | Easily-peelable Part | Easily-bondable Part |
| Presence of Abscence of Thin Film Layer | | Present | Absent | Present | Absent | Present | Absent | Present | Absent |
| Formation Example of Composite Oxide Film | | AS2 | | AS3 | | AS2 | | AS3 | |
| Application of Silane Coupling Agent | | Gas Phase Coating | | Gas Phase Coating | | Gas Phase Coating | | Gas Phase Coating | |
| Film | | F3 Non-slip Surface Performed | | F3 Non-slip Surface Performed | | F3 Non-slip Surface Performed | | F3 Non-slip Surface Performed | |
| Plasma Treatment on Film | | | | | | | | | |
| Initial Peel Strength | N/cm | 0.34 | 2.51 | 0.42 | 3.18 | 0.31 | 2.02 | 0.41 | 2.22 |
| Peel Strength after Treatment at 500° C. for 10 Minutes | N/cm | 0.31 | 2.86 | 0.46 | 3.55 | 0.35 | 2.56 | 0.45 | 2.83 |
| Appearance after Treatment at 500° C. for 30 Minutes | Visual Observation | Favorable | | Favorable | | Favorable | | Favorable | |

Application Example 5

The laminate obtained in Example 24 was used, and the same operation as in Application Example 1 was carried out to obtain a thin film transistor array.

Furthermore, the same operation as in Application Example 1 was carried out, and a frontplane of the electrophoretic display system was overlaid on the obtained thin film transistor array to obtain a display element of an electrophoretic display system. The display performance of the display element of the obtained electrophoretic display system was excellent.

After the frontplane was overlaid on the thin film transistor array, the display element portion was peeled from the inorganic plate in the same manner as in Application Example 1 to obtain a flexible electrophoretic display. The obtained electrophoretic display exhibited excellent display characteristics, and no deterioration in performance was observed even when the display was wound around a round bar of 5 mmφ.

Application Example 6

After the flexible electrophoretic display device is peeled in Application Example 5, the inorganic substrate was immersed in a 10% aqueous solution of sodium hydroxide at room temperature for 20 hours. After that, washing with water was performed, further, cleaning was performed with a glass washing device for a liquid crystal substrate, and after drying, UV ozone washing was performed for 3 minutes. Thereafter, the process returned to the above-mentioned step: <formation of silane coupling agent layer on inorganic substrate>, and thereafter, the operation of Example 24 was repeated to obtain a laminate. The quality of the obtained laminate was excellent, and it was in a state where recycle use was satisfactory possible.

Application Example 7

The laminate obtained in Example 17 was used, and then the same operation as in Application Example 3 was carried to form a copper thin film having a nickel-chromium alloy film as a base. Further, in the same manner as in Application Example 3, a thick copper plating layer (thick layer) having a thickness of 4 µm was formed. Subsequently, heat treatment was performed at 120° C. for 10 minutes for drying to form a copper foil layer on the polymer film surface of the laminate.

Further, each copper foil layer was subjected to etching processing using a photoresist in the same manner as in Application Example 3 to form a tin-plated test pattern of line/space=20 µm/20 µm. There were no disconnections or short circuits in the wiring pattern, and the pattern shape was also excellent. Next, the polymer film was peeled from the glass plate by the same method as in Application Example 1 to obtain a flexible wiring substrate. The flexibility of the obtained flexible wiring board was excellent.

Application Example 8

The laminate obtained in Example 24 was used, and the same operation as in application example 4 below was carried out to fabricate an array of P-channel TFTs using polysilicon. Furthermore, the polymer film portion on the outer periphery of the TFT array was burnt out in the same manner as in Application Example 4, and the TFT array portion was peeled to obtain a flexible TFT array. The obtained flexible TFT array did not exhibited any deterioration in performance even when wound around a round bar of 3 mmφ, and maintained excellent characteristics.

Examples 31 to 46

The same operation as in Example 1 except that the thin films obtained in Formation Examples 1 to 3 of the metal thin film were used as a thin film was carried out to obtain a laminated substrate. Furthermore, evaluation in the same manner was carried out. The results are shown in Table 8, Table 9, and Table 10.

TABLE 8

| Inorganic Substrate | Example 31 Glass | | Example 32 Glass | | Example 33 Glass | | Example 34 Wafer | | Example 35 Wafer | |
|---|---|---|---|---|---|---|---|---|---|---|
| | Easily-peelable Part | Easily-bondable Part | Easily-peelable Part | Easily-bondable Part | Easily-peelable Part | Easily-bondable Part | Easily-peelable Part | Easily-bondable Part | Easily-peelable Part | Easily-bondable Part |
| Metal Thin Film Layer | Present | Absent | Present | Absent | Present | Absent | Present | Absent | Present | Absent |
| Formation Example of Metal Thin Film Layer | MO1 | | MO1 | | MO1 | | MO1 | | MO1 | |
| Application of Silane Coupling Agent | Gas Phase Coating | | Gas Phase Coating | | Gas Phase Coating | | Gas Phase Coating | | Gas Phase Coating | |
| Film | F1 | | F2 | | F3 Non-slip Surface | | F3 Non-slip Surface | | F3 Non-slip Surface | |
| Plasma Treatment on Film | Performed | | Performed | | Performed | | Performed | | Not Performed | |
| Initial Peel Strength N/cm | 0.26 | 2.70 | 0.21 | 3.17 | 0.33 | 2.97 | 0.18 | 2.55 | 0.12 | 1.47 |
| Peel Strength after Heat Treatment at 500° C. N/cm | 0.25 | 4.01 | 0.21 | 4.07 | 0.34 | 3.91 | 0.26 | 5.00 | 0.14 | 1.07 |

TABLE 9

| Inorganic Substrate | Example 36 Glass | | Example 37 Glass | | Example 38 Glass | | Example 39 Wafer | | Example 40 Wafer | |
|---|---|---|---|---|---|---|---|---|---|---|
| | Easily-peelable Part | Easily-bondable Part | Easily-peelable Part | Easily-bondable Part | Easily-peelable Part | Easily-bondable Part | Easily-peelable Part | Easily-bondable Part | Easily-peelable Part | Easily-bondable Part |
| Metal Thin Film Layer | Present | Absent | Present | Absent | Present | Absent | Present | Absent | Present | Absent |
| Formation Example of Metal Thin Film Layer | W1 | | W1 | | W1 | | W1 | | W1 | |
| Application of Silane Coupling Agent | Gas Phase Coating | | Gas Phase Coating | | Gas Phase Coating | | Gas Phase Coating | | Gas Phase Coating | |
| Film | F1 | | F2 | | F3 Non-slip Surface | | F3 Non-slip Surface | | F3 Non-slip Surface | |
| Plasma Treatment on Film | Performed | | Performed | | Performed | | Performed | | Not Performed | |
| Initial Peel Strength N/cm | 0.20 | 2.22 | 0.18 | 2.42 | 0.23 | 2.49 | 0.14 | 1.86 | 0.09 | 1.44 |
| Peel Strength after Heat Treatment at 500° C. N/cm | 0.26 | 3.68 | 0.17 | 3.01 | 0.27 | 2.93 | 0.22 | 3.99 | 0.13 | 0.86 |

TABLE 10

| Inorganic Substrate | Example 41 Wafer | | Example 42 Wafer | | Example 43 Wafer | | Example 44 Wafer | | Example 45 Wafer | | Example 46 Wafer | |
|---|---|---|---|---|---|---|---|---|---|---|---|---|
| | Easily-peelable Part | Easily-bondable Part | Easily-peelable Part | Easily-bondable Part | Easily-peelable Part | Easily-bondable Part | Easily-peelable Part | Easily-bondable Part | Easily-peelable Part | Easily-bondable Part | Easily-peelable Part | Easily-bondable Part |
| Metal Thin Film layer Formation Example of MetalThin Film Layer | Present MW1 | Absent | Present MW1 | Absent | Present MW1 | Absent | Present MW1 | Absent | Present MW1 | Absent | Present MW1 | Absent |
| Application of Silane CouplingAgent Film | Gas Phase Coating F3 | | Spin Coating F3 | | Gas Phase Coating F3 | | Spin Coating F3 | | Gas Phase Coating F1 | | Spin Coating F1 | |
| Plasma Treatment on Film | Non-slip Surface Performed | | Non-slip Surface Performed | | Non-slip Surface Performed | | Non-slip Surface Performed | | Performed | | Performed | |
| Initial Peel Strength N/cm | 0.08 | 2.22 | 0.11 | 3.45 | 0.09 | 3.15 | 0.80 | 2.30 | 0.07 | 3.16 | 0.08 | 2.40 |
| Peel Strength after Heat Treatment at 500° C. N/cm | 0.13 | 3.12 | 0.13 | 4.09 | 0.10 | 3.72 | 0.10 | 2.70 | 0.09 | 3.21 | 0.12 | 2.64 |

Application Example 9

The laminate obtained in Example 38 was used, and the same operation as in Application Example 1 was carried out to obtain a thin film transistor array.

Furthermore, the same operation as in Application Example 1 was carried out, and a frontplane of the electrophoretic display system was overlaid on the obtained thin film transistor array to obtain a display element of an electrophoretic display system. The display performance of the display element of the obtained electrophoretic display system was excellent.

After the frontplane was overlaid on the thin film transistor array, the display element portion was peeled from the inorganic plate in the same manner as in Application Example 1 to obtain a flexible electrophoretic display. The obtained electrophoretic display exhibited excellent display characteristics, and no deterioration in performance was observed even when the display was wound around a round bar of 5 mmφ.

Application Example 10

After the flexible electrophoretic display device is peeled in Application Example 9, the inorganic substrate was immersed in a 10% aqueous solution of sodium hydroxide at room temperature for 20 hours. After that, washing with water was performed, further, cleaning was performed with a glass washing device for a liquid crystal substrate, and after drying, UV ozone washing was performed for 3 minutes. Thereafter, the process returned to the above-mentioned step: <formation of silane coupling agent layer on inorganic substrate>, and thereafter, the operation of Example 24 was repeated to obtain a laminate. The quality of the obtained laminate was excellent, and it was in a state where recycle use was satisfactory possible.

Application Example 11

The laminate obtained in Example 31 was then subjected to the same operation as in Application Example 3 to form a copper thin film having a nickel-chromium alloy film as a base. Further, in the same manner as in Application Example 3, a thick copper plating layer (thick layer) having a thickness of 4 μm was formed. Subsequently, heat treatment was performed at 120° C. for 10 minutes for drying to form a copper foil layer on the polymer film surface of the laminate.

Further, each copper foil layer was subjected to etching processing using a photoresist in the same manner as in Application Example 3 to form a tin-plated test pattern of line/space=20 μm/20 μm. There were no disconnections or short circuits in the wiring pattern, and the pattern shape was also excellent. Next, the polymer film was peeled from the glass plate by the same method as in Application Example 1 to obtain a flexible wiring substrate. The flexibility of the obtained flexible wiring board was excellent.

Application Example 11

The laminate obtained in Example 38 was used, and the same operation as in application example 4 below was carried out to fabricate an array of P-channel TFTs using polysilicon. Furthermore, the polymer film portion on the outer periphery of the TFT array was burnt out in the same manner as in Application Example 4, and the TFT array portion was peeled to obtain a flexible TFT array. The obtained flexible TFT array did not exhibited any deterioration in performance even when wound around a round bar of 3 mmφ, and maintained excellent characteristics.

INDUSTRIAL APPLICABILITY

In the easily-peelable part of the polymer film laminated substrate of the present invention, the polyimide film on which the electronic device is mounted can be easily peeled from the inorganic substrate with an extremely small load after the electronic device is formed on the polyimide film. In addition, since the easily-bondable part stably bonds the film and the inorganic substrate even during various steps of device production, problems such as peeling during the steps do not occur. Even if the peeled inorganic substrate is recycled, the polyimide film on which the electronic device is mounted can be easily peeled from the inorganic substrate in the same manner as before the recycling, which is particularly useful for producing flexible electronic devices. The contribution to the industry is great.

The invention claimed is:

1. A polymer film laminated substrate comprising a thin film continuously or discontinuously formed on a part of at least one surface of an inorganic substrate; a silane coupling agent layer continuously or discontinuously formed on the thin film; and further a polymer film layer laminated on the silane coupling agent layer, wherein the thin film is (i) a thin film of an aluminum oxide, (ii) a thin film of a composite oxide of aluminum and silicon, or (iii) a thin film of at least one metal selected from molybdenum and tungsten, a surface on which the polymer film is laminated includes: an easily-peelable part being a region in which the polymer film can be easily separated from the inorganic substrate together with the silane coupling agent layer when the polymer film is cut; and an easily-bondable part being a region in which the polymer film cannot be easily separated from the inorganic substrate, and bonding strength of the easily-peelable part is 0.5 N/cm or less.

2. The polymer film laminated substrate according to claim 1, wherein the bonding strength of the easily-peelable part after heat treatment at 500° C. for 10 minutes is 0.5 N/cm or less.

3. The polymer film laminated substrate according to claim 2, wherein the thin film is discontinuously formed on at least one surface of the inorganic substrate, the easily-peelable part is covered with the thin film, and the easily-bondable part is not covered with the thin film.

4. The polymer film laminated substrate according to claim 3, wherein the polymer film is a polyimide film.

5. The polymer film laminated substrate according to claim 4, which is used to temporarily support a polymer film material on the inorganic substrate when an electronic device is formed on the polymer film.

6. The polymer film laminated substrate according to claim 1, wherein the thin film is discontinuously formed on at least one surface of the inorganic substrate, the easily-peelable part is covered with the thin film, and the easily-bondable part is not covered with the thin film.

7. The polymer film laminated substrate according to claim 1, wherein the polymer film is a polyimide film.

8. The polymer film laminated substrate according to claim 1, which is used to temporarily support a polymer film material on the inorganic substrate when an electronic device is formed on the polymer film.

9. A method for producing a flexible electronic device, comprising the steps of:

continuously or discontinuously forming a thin film on a part of at least one surface of an inorganic substrate;

continuously or discontinuously forming a silane coupling agent layer on the thin film;

laminating a polymer film layer on the silane coupling agent layer;

forming an electronic device on the polymer film; and cutting the polymer film layer and peeling at least a part of the polymer film layer from the inorganic substrate together with the electronic device, wherein the thin film is (i) a thin film of an aluminum oxide, (ii) a thin film of a composite oxide of aluminum and silicon, or (iii) a thin film of at least one metal selected from molybdenum and tungsten.

* * * * *